United States Patent
Kim et al.

(10) Patent No.: US 9,754,785 B2
(45) Date of Patent: Sep. 5, 2017

(54) METHODS OF MANUFACTURING SEMICONDUCTOR DEVICES

(71) Applicants: Eun-Jung Kim, Daegu (KR); Sung-Un Kwon, Suwon-si (KR); Yong-Kwan Kim, Yongin-si (KR); Yoo-Sang Hwang, Suwon-si (KR); Young-Sik Seo, Hwaseong-si (KR)

(72) Inventors: Eun-Jung Kim, Daegu (KR); Sung-Un Kwon, Suwon-si (KR); Yong-Kwan Kim, Yongin-si (KR); Yoo-Sang Hwang, Suwon-si (KR); Young-Sik Seo, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/993,141

(22) Filed: Jan. 12, 2016

(65) Prior Publication Data
US 2016/0203983 A1 Jul. 14, 2016

(30) Foreign Application Priority Data
Jan. 14, 2015 (KR) ........................ 10-2015-0006587

(51) Int. Cl.
*H01L 21/033* (2006.01)
*H01L 21/308* (2006.01)
*H01L 21/311* (2006.01)
*H01L 21/3213* (2006.01)
*H01L 27/108* (2006.01)

(52) U.S. Cl.
CPC ...... *H01L 21/0337* (2013.01); *H01L 21/3086* (2013.01); *H01L 21/31144* (2013.01); *H01L 21/32139* (2013.01); *H01L 27/10814* (2013.01); *H01L 27/10876* (2013.01); *H01L 27/10885* (2013.01)

(58) Field of Classification Search
CPC ............. H01L 21/0337; H01L 21/3086; H01L 21/31144; H01L 21/32139
See application file for complete search history.

(56) References Cited

U.S. PATENT DOCUMENTS 5,710,066 A 1/1998 Okamoto et al.
8,197,996 B2 6/2012 Fonseca et al.
(Continued)

FOREIGN PATENT DOCUMENTS

KR 1020100019798 A 2/2010

*Primary Examiner* — Duy Deo
(74) *Attorney, Agent, or Firm* — Volentine & Whitt, PLLC

(57) ABSTRACT

In a method of manufacturing a semiconductor device, sacrificial layer patterns extending in a first direction are formed on an etch target layer. Preliminary mask patterns are formed on opposite sidewall surfaces of each of the sacrificial layer patterns. A filling layer is formed to fill a space between the preliminary mask patterns. Upper portions of the preliminary mask patterns are etched to form a plurality of mask patterns. Each of the mask patterns is symmetric with respect to a plane passing a center point of each of the mask patterns in a second direction substantially perpendicular to the first direction and extending in the first direction. The sacrificial layer patterns and the filling layer are removed. The etch target layer is etched using the mask patterns as an etching mask to form a plurality of target layer patterns.

18 Claims, 23 Drawing Sheets

(56) References Cited

U.S. PATENT DOCUMENTS

| | | |
|---|---|---|
| 8,338,304 B2 | 12/2012 | Zhou |
| 8,507,384 B2 | 8/2013 | Zhu |
| 8,530,357 B2 | 9/2013 | Iwao |
| 2008/0008969 A1 | 1/2008 | Zhou et al. |
| 2011/0300711 A1 | 12/2011 | Martin et al. |
| 2013/0032945 A1 | 2/2013 | Lin et al. |
| 2013/0034962 A1 | 2/2013 | Yu |
| 2013/0034963 A1 | 2/2013 | Chung et al. |
| 2013/0109148 A1 | 5/2013 | Oh et al. |
| 2014/0220782 A1 | 8/2014 | Seo |
| 2014/0328125 A1 | 11/2014 | Min et al. |
| 2015/0001687 A1* | 1/2015 | Zhang ............... H01L 29/06 257/622 |
| 2015/0087149 A1* | 3/2015 | He ............... H01L 21/0338 438/696 |
| 2016/0204034 A1* | 7/2016 | Sung ............... H01L 21/823412 438/703 |

\* cited by examiner

FIRST DIRECTION
SECOND DIRECTION

FIRST
DIRECTION

SECOND
DIRECTION

METHODS OF MANUFACTURING SEMICONDUCTOR DEVICES

PRIORITY STATEMENT

This application claims priority under 35 USC §119 to Korean Patent Application No. 10-2015-0006587, filed on Jan. 14, 2015 in the Korean Intellectual Property Office (KIPO), the contents of which are incorporated by reference herein in their entirety.

BACKGROUND

1. Field

The inventive concept relates to methods of manufacturing semiconductor devices. More particularly, the inventive concept relates to methods of forming minute patterns in the manufacturing of semiconductor devices.

2. Description of the Related Art

Highly integrated semiconductor devices include elements or features constituting fine patterns such as circuit patterns and the like. Therefore, the manufacturing of highly integrated semiconductor devices requires the forming of patterns of minute features having a critical dimension of about several nanometers to about tens of nanometers. The forming of such minute features to meet the demand for today's highly integrated semiconductor devices imposes many challenges in the overall manufacturing process.

SUMMARY

According to an aspect of the inventive concept, there is provided a method of manufacturing a semiconductor device which includes forming a plurality of sacrificial layer line patterns on an etch target, each of the sacrificial layer line patterns extending longitudinally in a first direction so as to have sidewall surfaces facing in a second direction substantially perpendicular to the first direction, forming preliminary mask patterns on the sidewall surfaces of the sacrificial layer patterns, respectively, forming a filling layer in spaces between the preliminary mask patterns, etching upper portions of the preliminary mask patterns to form a plurality of mask patterns, each of the mask patterns being symmetric with respect to a plane passing a center point of each of the mask patterns in the second direction and extending in the first direction, removing the sacrificial layer line patterns and the filling layer, and etching the etch target using the mask patterns as an etching mask to form a plurality of target layer patterns.

According to another aspect of the inventive concept, there is also provided a method of manufacturing a semiconductor device which includes forming a plurality of sacrificial layer line patterns on an etch target, each of the sacrificial layer patterns extending longitudinally in a first direction, conformally forming a mask layer on the sacrificial layer pattern and the etch target, forming a filling layer in spaces between neighboring portions of the mask layer, etching upper portions of the mask layer to expose a top surface of the sacrificial layer pattern to form a plurality of mask patterns, each of the mask patterns including a first linear section, a second linear section and a connecting portion connecting the first and second linear sections to each other at bottom parts of the first and second linear portions, removing the sacrificial layer line patterns and the filling layer, and anisotropically etching the connecting portion of each of the mask patterns and the etch target to form a plurality of target layer patterns.

According to yet another aspect of the inventive concept, there is provided a method of manufacturing a semiconductor device that includes forming a sacrificial layer pattern structure on an etch target, selectively etching the sacrificial layer pattern structure to form holes extending therethrough and exposing the etch target, and subsequently etching the etch target using the sacrificial layer pattern structure as an etch mask to thereby form holes in the etch target corresponding to the holes extending through the sacrificial layer pattern structure. The forming of the sacrificial layer pattern structure includes forming a first sacrificial layer on the etch target, forming a first mask layer on the sacrificial layer, forming a plurality of sacrificial layer line patterns on the first mask layer, each of the sacrificial layer line patterns extending longitudinally in a first direction so as to have sidewall surfaces facing in a second direction substantially perpendicular to the first direction, forming preliminary mask patterns on the sidewall surfaces of the sacrificial layer patterns, respectively, forming a filling layer in spaces between the preliminary mask patterns, etching upper portions of the preliminary mask patterns to form a plurality of first mask patterns, each of the first mask patterns being symmetric with respect to a plane passing a center point of each of the mask patterns in the second direction and extending in the first direction, removing the sacrificial layer line patterns and the filling layer, and etching the first mask layer using the first mask patterns as an etch mask to form a first mask having sections extending longitudinally in the first direction and spaced apart in the second direction, and etching the first sacrificial layer using the first mask to form first sacrificial layer patterns extending longitudinally in the first direction.

BRIEF DESCRIPTION OF THE DRAWINGS

The inventive concept will be more clearly understood from the following detailed description made in conjunction with the accompanying drawings.

FIGS. 1 to 8 illustrate a method of manufacturing a semiconductor device in accordance with the inventive concept, with each of FIGS. 1, 2, 3, 4, 5, 6, 7, and 8 being a cross-sectional view of the device during the course of its manufacture;

FIGS. 9 to 16 illustrate another method of manufacturing a semiconductor device in accordance with the inventive concept, with each of FIGS. 9, 10, 11, 12, 13, 14, 15 and 16 being a cross-sectional view of the device during the course of its manufacture;

FIGS. 17 to 20 illustrate stages of yet another method of manufacturing a semiconductor device in accordance with the inventive concept, with each of FIGS. 17, 18, 19 and 20 being a cross-sectional view of the device during the course of its manufacture;

FIGS. 21 to 27 illustrate still another method of manufacturing a semiconductor device in accordance with the inventive concept, with each of FIGS. 21, 22, 23, 24, 25, 26 and 27 being a perspective view of the device during the course of its manufacture; and FIGS. 28 to 36 illustrate still another method of manufacturing a semiconductor device in accordance with the inventive concept, with FIGS. 29 and 32 each being a plan view of the device during the course of its manufacture, and FIGS. 28, 30, 31, 33, 34, 35 and 36 being cross-sectional views taken in the direction of lines I-I' and II-II' in FIGS. 29 and 32.

DETAILED DESCRIPTION

Figure 1:
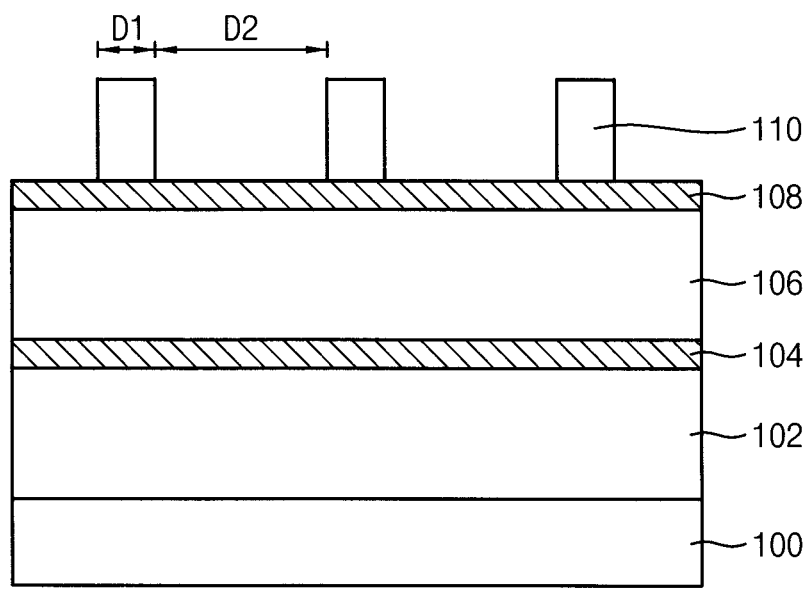
FIGS. 1 to 36 represent non-limiting, examples of the inventive concept.

Various examples of methods of manufacturing a semiconductor device according to the inventive concept will be described more fully hereinafter with reference to the accompanying drawings. The inventive concept may, however, be practiced in many different forms and should not be construed as limited to the examples set forth herein. Rather, these examples are provided so that this description will be thorough and complete, and will fully convey the scope of the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the examples.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples only and is not intended to be limiting of the examples. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples are described herein with reference to schematic cross-sectional illustrations (of final and intermediate structures) that are idealized. As such, variations from the shapes of the illustrated structures as a result, for example, of manufacturing techniques and/or tolerances, are to be expected. Thus, examples should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the examples.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein. For example, the term "pattern" may refer to essentially any individual feature or series of features formed by a patterning process such as an etch process. The term "extending" will generally be used in reference to the longest or lengthwise dimension of a particular element or feature, i.e., will refer to a longitudinal direction of a feature or object even if not explicitly stated.

FIGS. 1 to 8 illustrate stages of an example of a method of manufacturing a semiconductor device in accordance with the inventive concept.

Referring to FIG. 1, an etch target layer 102 may be formed on a substrate 100. A lower mask layer 104, a sacrificial layer 106 and an upper mask layer 108 may be sequentially formed on the etch target layer 102. A photoresist pattern 110 may be formed on the upper mask layer 108.

The substrate 100 may be a semiconductor substrate, e.g., a silicon substrate, a germanium substrate, a silicon-germanium substrate, a silicon-on-insulator (SOI) substrate, a germanium-on-insulator (GOI) substrate, or the like.

The etch target layer 102 may be a layer of insulating material, conductive material, or semiconductor material. Examples of the insulating material are silicon oxide, silicon nitride, and silicide oxynitride. Examples of the conductive material are metals, metal nitrides, metal silicides, metal silicon nitrides, and an example of the semiconductor material is polysilicon.

The etch target layer 102 may be formed by a chemical vapor deposition (CVD) process, a plasma enhanced chemical vapor deposition (PE-CVD) process, a low pressure chemical vapor deposition (LP-CVD) process, a high density plasma chemical vapor deposition (HDP-CVD) process, a spin coating process, a sputtering process, an atomic layer deposition (ALD) process, and/or a physical vapor deposition (PVD) process.

However, the etch target layer 102 may be omitted when the substrate 100 is the layer or structure to be etched. Thus, the term "etch target" may refer to either the etch target layer 102 or the substrate 100.

The lower mask layer 104 is formed of material capable of serving as an etching mask for etching the etch target layer 102. That is, the lower mask layer 104 may be formed of material having a high etching selectivity with respect to the etch target layer 102. Thus, the material of the lower mask layer 104 may be chosen according to the material of the etch target layer 102.

For example, the lower mask layer 104 may be formed of silicon nitride or silicon oxynitride. In this case, the lower mask layer 104 may also serve as an anti-reflective layer. In some examples, the lower mask layer 104 is a layer of silicon oxide.

However, the lower mask layer 104 is optional. That is, in some examples the lower mask layer 104 is omitted.

The sacrificial layer 106 may serve as a mold layer for forming an etching mask, and may be removed by subsequent processes. Thus, the sacrificial layer 106 may be formed of material having a high etching selectivity with respect to the etching mask. Also, the sacrificial layer 106 may be formed of material that may be easily and selectively removed.

For example, the sacrificial layer 106 may be formed of an amorphous carbon layer (ACL) or a carbon-containing layer. In particular, the sacrificial layer 106 may be an organic compound layer including a hydrocarbon compound containing an aromatic ring, such as a phenyl, benzene, naphthalene, etc., or a derivative thereof, any of which may be formed by a spin coating process. Then, the organic compound layer may be baked to form the sacrificial layer 106. Such an amorphous carbon layer (ACL) or the carbon-containing layer may be referred to as a spin-on-hardmask (SOH).

Alternatively, the sacrificial layer 106 may be a polysilicon layer formed by a CVD process.

The upper mask layer 108 may be formed of material capable of serving as an etching mask for etching the sacrificial layer 106. That is, the upper mask layer 108 may be formed of material having a high etching selectivity with respect to the sacrificial layer 106. For example, the upper mask layer 108 may be formed of silicon nitride or silicide oxynitride. In this case, the upper mask layer 108 may also serve as an anti-reflective layer.

The photoresist pattern 110 may be a line and space pattern, composed of the lines of photoresist (referred to hereinafter as "lines of the photoresist pattern 110") each extending lengthwise in a first direction. The width D1 of each of the lines of the photoresist pattern 110 may be substantially the same as a first target distance between the subsequently formed target layer patterns 102a (see FIG. 8). Also, the distance D2 between the lines of the photoresist pattern 110 may be substantially the same as a sum of the first distance D1 and twice a first width W1 (refer to FIG. 3). The first width W1 may be a target width in the second direction of the subsequently formed target layer pattern 102a. In one example, the first distance D1 and the first width W1 are substantially the same as each other such that the second distance D2 is about 3 times the first width W1.

The photoresist pattern 110 may be formed by depositing photoresist on the upper mask layer 108, baking the resultant layer to form a film of the photoresist, exposing the film of photoresist to an image of a pattern, and developing the exposed layer of photoresist to remove the exposed or non-exposed portion of the layer of photoresist coating and baking a photoresist material to form a photoresist film, and exposing and developing the photoresist film. The exposure process may use an ArF excimer laser, KrF excimer laser, G-line, I-line, electron beam, or an extreme ultraviolet (EUV) beam to expose the film of photoresist.

Figure 2:
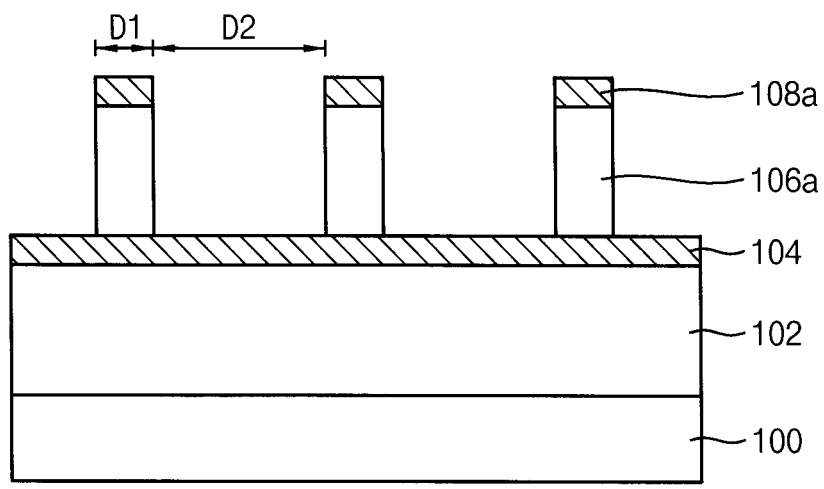

Referring to FIG. 2, the upper mask layer 108 may be anisotropically etched using the photoresist pattern 110 as an etching mask to form an upper mask 108a. During the etching process, the photoresist pattern 110 may be partially etched. The sacrificial layer 106 may be anisotropically etched using the upper mask 108a as an etching mask to form a sacrificial layer pattern 106a. In one example, the upper mask 108a remains on the sacrificial layer pattern 106a after the sacrificial layer 106 has been selectively etched through.

As a result, a plurality of lines of the sacrificial layer pattern 106a may be formed, and each of the lines of the sacrificial layer pattern 106a may extend lengthwise in the first direction. The width of each of the sacrificial layer patterns 106a, in the second direction, may be substantially the same as the first distance D1. A distance between adjacent ones of the lines of the sacrificial layer pattern 106a may be substantially the same as the second distance D2. The lines of the sacrificial layer pattern 106a will be referred to hereinafter as the sacrificial layer line patterns 106a.

Figure 3:
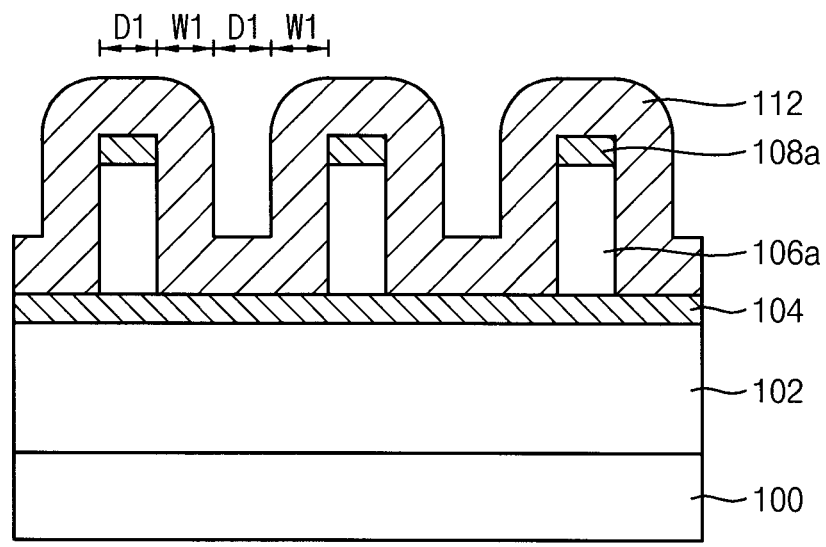

Referring to FIG. 3, a mask layer 112 may be conformally formed on the sacrificial layer line patterns 106a, the upper mask 108a and the lower mask layer 104. When the mask layer 112 is formed to have a uniform thickness, portions of the mask layer 112 on top edges of the sections (or "segments") of the upper mask 108a may be rounded. In one example, the radius of curvature of the portions of the mask layer 112 on the top edges of the segments of the upper mask 108a are substantially the same as the thicknesses of all other portions of the mask layer 112.

The mask layer 112 may be formed by an ALD process or a CVD process. When the target layer pattern 102a has a width of about several nanometers to about tens of nanometers, the mask layer 112 is preferably formed by an ALD process.

The mask layer 112 may serve as an etching mask for etching the lower mask layer 104. Thus, the mask layer 112 may be formed to have a high etching selectivity with respect to the lower mask layer 104.

In an example in which the lower mask layer 104 is not formed, the mask layer 112 may serve as an etching mask for etching the etch target layer 102. In this case, the mask layer 112 may be formed to have a high etching selectivity with respect to the etch target layer 102.

The mask layer 112 may be formed to have a thickness substantially the same as the first width W1. Portions of the mask layer 112 on sidewall surfaces of each of the sacrificial layer line patterns 106a may each have a thickness equal to the first width W1 in the second direction. The distance in the second direction between the portions of the mask layers 112 on confronting sidewall surfaces of the sacrificial layer patterns 106a may be substantially the same as the first distance D1.

Figure 4:
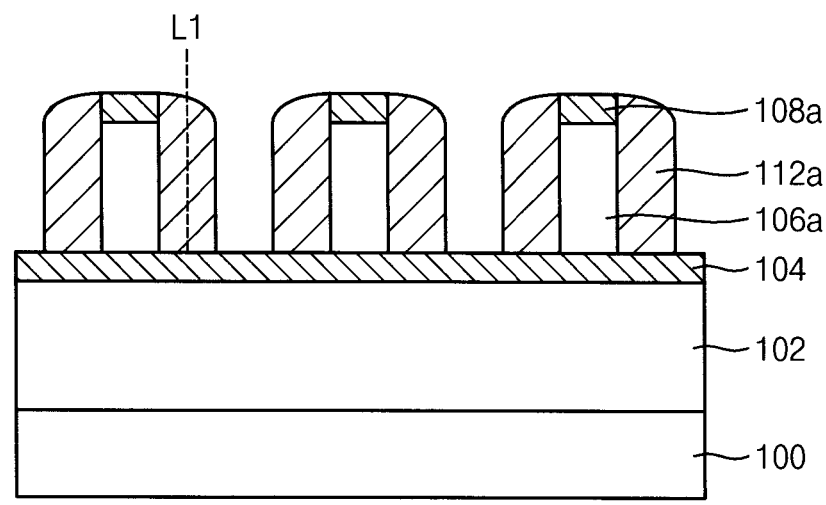

Referring to FIG. 4, the mask layer 112 may be anisotropically etched until a top surface of the lower mask layer 104 is exposed to form preliminary mask patterns 112a on both sidewall surfaces of each of the sacrificial layer patterns 106a.

Neighboring ones of the preliminary mask patterns 112a may have significantly different shapes from on another because the portions of the mask layer 112 on the top edge portion of each of the segments of the upper mask 108a were rounded. Also, each of the preliminary mask patterns 112a may be asymmetric with respect to a plane L1 passing through a central point of each of the preliminary mask patterns 112a in the second direction and extending in the first direction. Therefore, the portion (a first portion) of the top surface of each of the preliminary mask patterns 112a between the plane L1 and the closest sidewall surface of the sacrificial layer patterns 106a in the second direction may be higher than the portion (a second portion) of the top surface remote from the sidewall surface with respect to the plane L1. Also, therefore, the height of the top surface of each of the preliminary mask patterns 112a, as measured from a reference plane such as the upper surface of the substrate 100, may gradually decrease from the first portion toward the second portion thereof.

Figure 5:
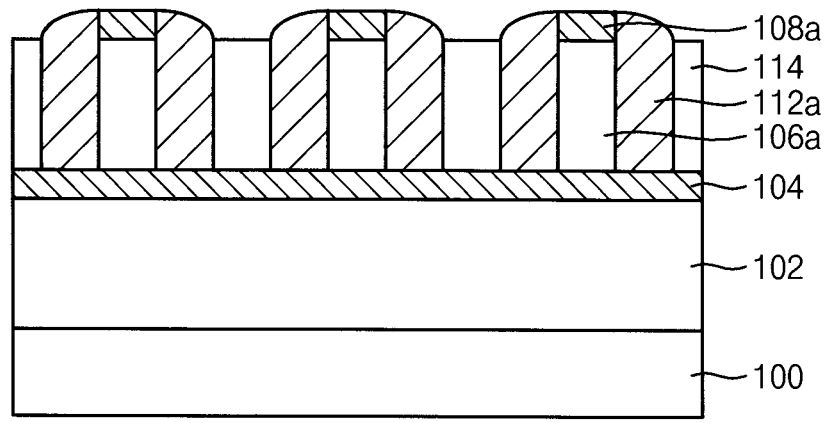

Referring to FIG. 5, a filling layer may be formed on the lower mask layer 104 to fill a space between the preliminary mask patterns 112a.

In one example, the filling layer is formed of material substantially the same as the material of the sacrificial layer line patterns 106a. For example, the filling layer may be an ACL layer or a carbon-containing layer. In this case, the filling layer may be formed by a spin coating process. Alternatively, the filling layer may be formed of polysilicon by a CVD process.

The filling layer may be planarized by an etch back process until a top surface of the upper mask 108a is exposed to form a filling layer pattern 114 filling the space between the preliminary mask patterns 112a.

Figure 6:
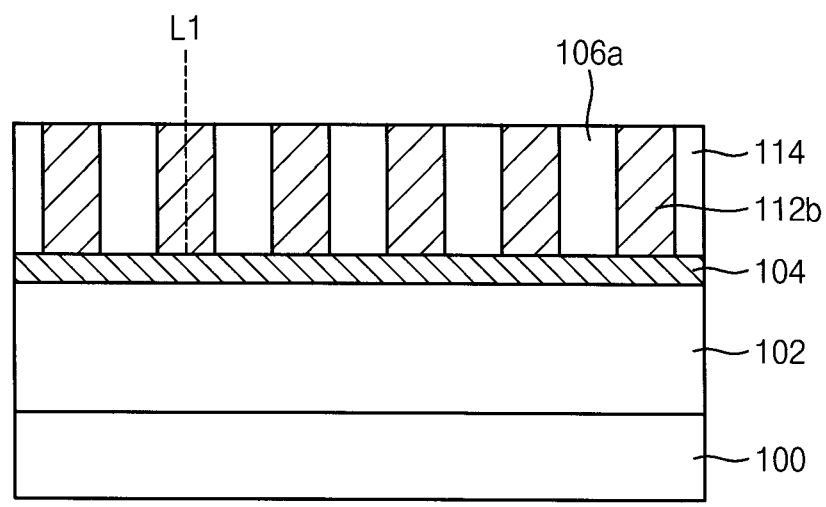

Referring to FIG. 6, the upper mask 108a may be removed by an etch back process. Upper portions of the preliminary mask patterns 112a may be etched by an etch back process to form mask patterns 112b having substantially the same shape as each other. During the etch back process, the sacrificial layer line patterns 106a and the filling layer pattern 114 may be partially etched.

Each of the mask patterns 112b may be symmetric with respect to the plane L1 passing through the center point of the mask pattern 112b in the second direction and extending in the first direction. In one example, top surfaces of the mask patterns 112b are substantially coplanar.

In other examples, a central portion in the second direction of a top surface of each of the mask patterns 112b may be higher than edge portions in the second direction of the top surface, and the height of the top surface of each of the mask patterns 112b may gradually decrease from the central portion toward each of the edge portions thereof.

If a mask pattern were asymmetric with respect to a plane passing a center point of the mask pattern in the second direction and extending in the first direction, each of a plurality of patterns subsequently formed using the mask pattern as an etching mask could have non-uniform sidewall surfaces, and widths of the patterns could vary greatly. However, in a method according to the inventive concept as described above, each of the mask patterns 112b will be symmetric with respect to such a plane, and thus widths of patterns subsequently formed using the mask patterns 112b as an etching mask will be substantially the same, i.e., will vary little from one another.

When the upper mask 108a is removed by the etch back process, the entire top surface of the lower mask layer 104 may remain covered by the sacrificial layer patterns 106a, the filling layer pattern 114 and the preliminary mask patterns 112a. Thus, when the upper mask is 108a are removed, the top surface of the lower mask layer 104 may be neither etched nor damaged.

If the top surface of the lower mask layer 104 were to be partially etched or damaged, the top surface of the lower mask layer 104 could have a height difference between a damaged portion and a non-damaged portion. In this case, in which a lower mask 104a (FIG. 8) is formed from the lower mask layer 104, the target layer patterns 102a formed using the lower mask 104a as an etching mask would have great differences in height and great variations among there widths. However, in the above-described method according to the inventive concept, the top surface of the lower mask layer 104 is not be damaged, so that any height difference and/or width variation of the target layer patterns 102a formed using the lower mask 104a as an etching mask may be minimized.

Figure 7:
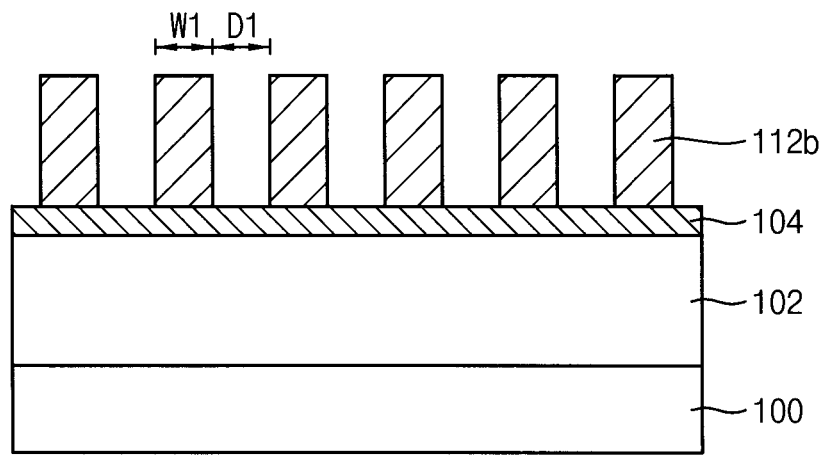

Referring to FIG. 7, the sacrificial layer patterns 106a and the filling layer pattern 114 may be removed, and the mask patterns 112b may remain on the lower mask layer 104. Each of the mask patterns 112b may have the first width W1, and the mask patterns 112b may be spaced apart from each other by the first distance D1.

In an example in which the sacrificial layer line patterns 106a and the filling layer pattern 114 constitute an ACL or a carbon-containing layer, the sacrificial layer line patterns 106a and the filling layer pattern 114 may be removed by a plasma ashing process.

In an example in which the sacrificial layer line patterns 106a and the filling layer pattern 114 are constitute a polysilicon layer, the sacrificial layer line patterns 106a and the filling layer pattern 114 may be removed by an isotropic etching process.

Figure 8:
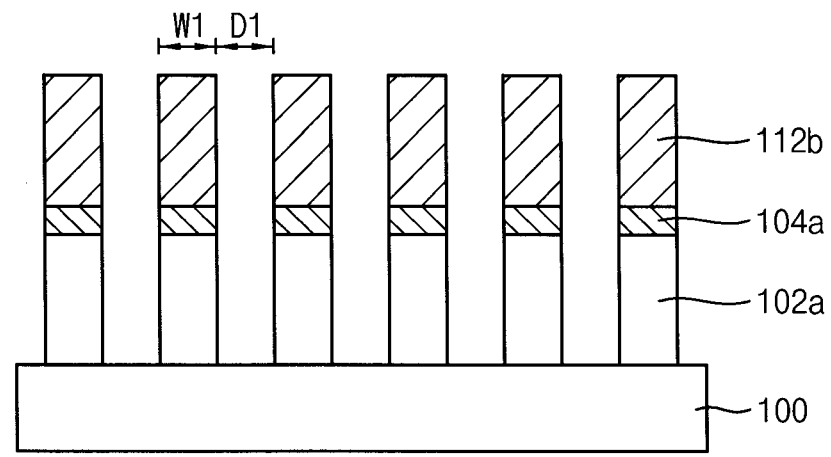

Referring to FIG. 8, the lower mask layer 104 may be anisotropically etched using the mask patterns 112b as an etching mask to form the lower mask 104a.

The etch target layer 102 may be etched using the lower mask 104a as an etching mask to form the target layer patterns 102a. During the etching process, the lower mask 104a may be partially or completely removed.

Each of the target layer patterns 102a may have the first width W1, and the target layer patterns 102a may be spaced apart from each other by the first distance D1.

As described above, each of the mask patterns 112b may be symmetric with respect to the plane passing the center point of each of the mask patterns 112b in the second direction and extending in the first direction. Thus, each of the target layer patterns 102a formed using the mask patterns 112b as an etching mask may have a uniform width. When the upper mask 108a is removed by the etch back process, the top surface of the lower mask layer 104 is not damaged. Thus, the target layer patterns 102a will have minimal height differences and width variations.

FIGS. 9 to 16 illustrate another example of a method of manufacturing a semiconductor device in accordance with the inventive concept.

Figure 9:
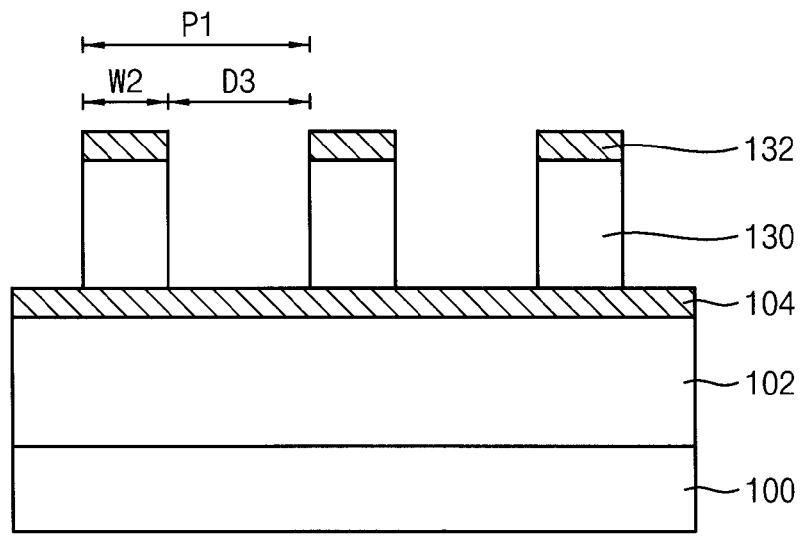

Referring to FIG. 9, an etch target layer 102 may be formed on a substrate 100. A lower mask layer 104, a sacrificial layer and an upper mask layer may be sequentially formed on the etch target layer 102. The etch target layer 102, the lower mask layer 104, the sacrificial layer and the upper mask layer may be formed by processes similar to those illustrated with reference to FIG. 1.

A photoresist pattern (not shown) may be formed on the upper mask layer. For example, the photoresist pattern may be a line and space pattern composed of a plurality of lines of photoresist with each of the lines of photoresist extending lengthwise in a first direction. Each of the lines of photoresist may be formed to have a width W2 in a second direction substantially perpendicular to the first direction that may be greater than a target distance between subsequently formed target layer patterns 102a (refer to FIG. 12). The photoresist patterns may be spaced apart from each other by a distance D3 in the second direction.

A pitch P1 of the photoresist pattern is the distance between a first sidewall surface of a first one of the lines of the photoresist pattern to a first sidewall surface of a neighboring second one of the lines of photoresist pattern that faces a second sidewall surface of the first one of the lines of the photoresist pattern. That is, the pitch may be equal to the sum of the width W2 of each of the lines of the photoresist pattern and the distance D3.

The upper mask layer may be anisotropically etched using the photoresist pattern as an etching mask to form an upper mask 132. During the etching process, the photoresist pattern may be almost entirely removed. The sacrificial layer may be anisotropically etched using the upper mask 132 as an etching mask to form a plurality of sacrificial layer patterns 130. Respective sections (or "segments") of the upper mask 132 may remain on the sacrificial layer patterns 130, respectively.

Each of the sacrificial layer patterns 130 may be formed to extend lengthwise in the first direction. Each of the sacrificial layer patterns 130 may have the width W2 in the second direction, and the sacrificial layer patterns 130 may be spaced apart from each other by the distance D3.

In this example, the ratio of the height to width of the sacrificial layer patterns 130 is relatively small. Thus, the sacrificial layer patterns 130 are not likely to lean or fall over.

Figure 10:
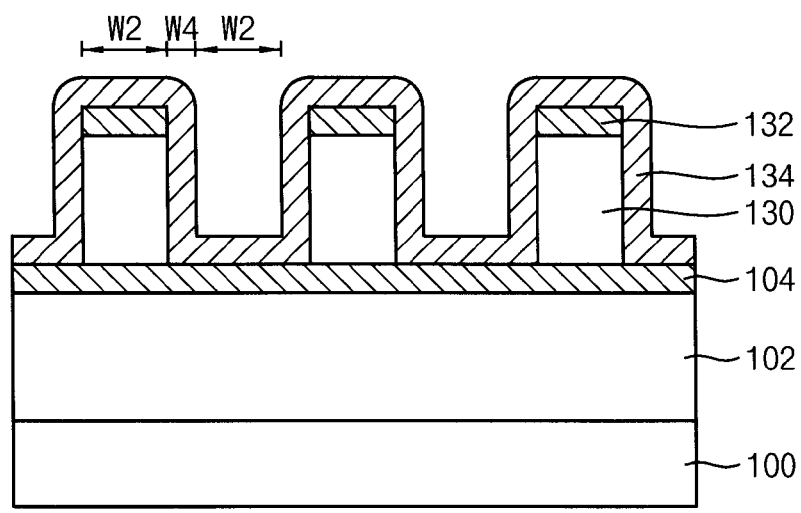

Referring to FIG. 10, a mask layer 134 may be conformally formed on the sacrificial layer patterns 130, the upper mask 132 and the lower mask layer 104.

The mask layer 134 may serve as an etching mask for etching the lower mask layer 104 in a subsequent process. Thus, the mask layer 134 may be formed to have a high etching selectivity with respect to the lower hard mask layer 104. For example, the mask layer 134 may be formed of silicon oxide by an ALD process.

The portions of the mask layer 134 on sidewall surfaces of the sacrificial layer patterns 130 may be relatively thin, i.e., the thickness W4 of these portions may be relatively small. The distance in the second direction between the portions of the mask layer 134 on confronting sidewall surfaces of the sacrificial layer patterns 130 may be substantially the same as the width W2 of each of the sacrificial layer patterns 130.

Figure 11:
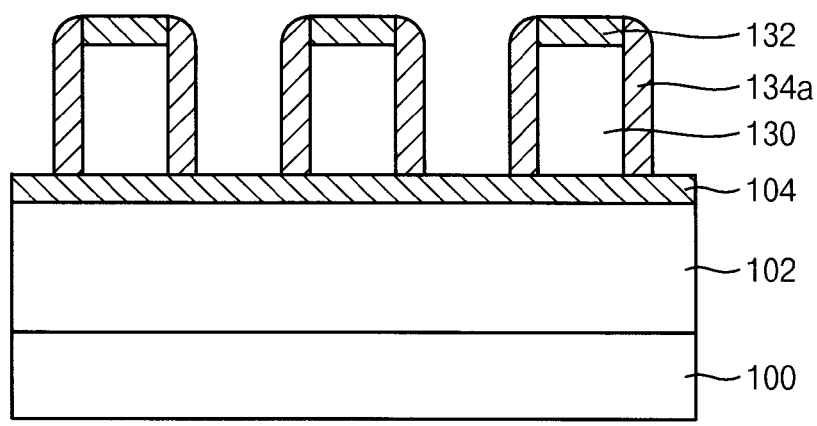

Referring to FIG. 11, the mask layer 134 may be anisotropically etched until a top surface of the lower mask layer 104 is exposed to form preliminary mask patterns 134a on both sidewall surfaces of the sacrificial layer patterns 130.

Each of the preliminary mask patterns 134a may be asymmetric with respect to a plane passing through a center point of each of the preliminary mask patterns 134a in the second direction and extending in the first direction. After forming the preliminary mask patterns 134a, segments of the upper mask 132 may remain on the sacrificial layer patterns 130, respectively.

Figure 12:
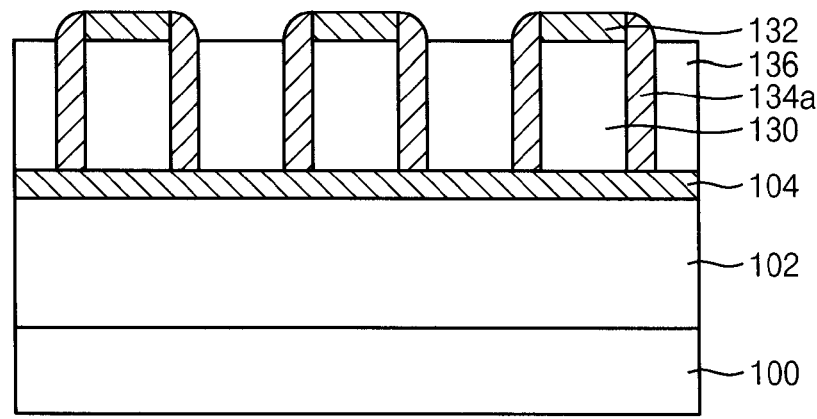

Referring to FIG. 12, a filling layer may be formed to fill a space between the preliminary mask patterns 134a.

The filling layer may be formed of material substantially the same as the material of the sacrificial layer patterns 130. For example, the filling layer may be an ACL layer or a carbon-containing layer. In this case, the filling layer may be formed by a spin coating process. Alternatively, the filling layer may be formed of polysilicon by a CVD process.

The filling layer may be planarized by an etch back process until a top surface of the upper masks 132 is exposed to form a filling layer pattern 136 filling a space between the preliminary mask patterns 134a.

Figure 13:
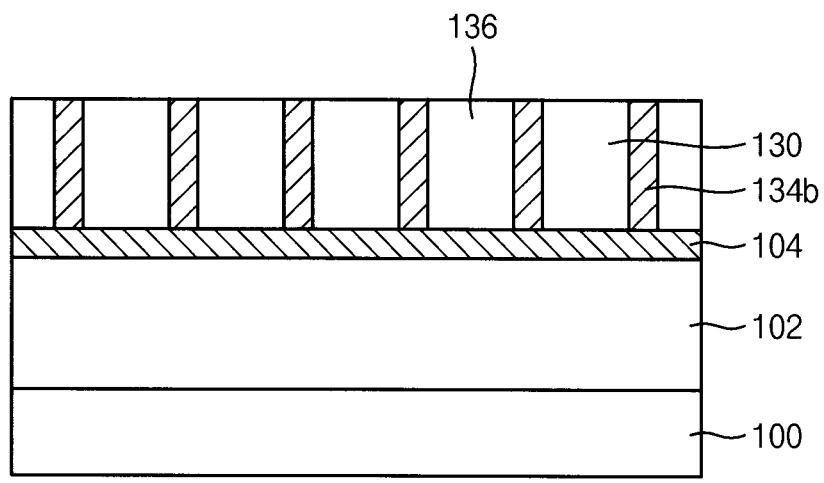

Referring to FIG. 13, the upper mask 132 may be removed by an etch back process. Upper portions of the preliminary mask patterns 134a may be etched by the etch back process to form a plurality of second preliminary mask patterns 134b. During the etch back process, the sacrificial layer patterns 130 and filling layer pattern 136 may be partially etched.

Each of the second preliminary mask patterns 134b may be symmetric with respect to a plane passing through a center point of each of the second preliminary mask patterns 134b in the second direction and extending in the first direction. In the illustrated example, the sacrificial preliminary mask patterns 134b have substantially the same shape as one another.

While the upper mask 132 is being removed the an etch back process, the entire top surface of the lower mask layer 104 may be covered by the sacrificial layer patterns 130, the filling layer pattern 136 and the first preliminary mask pattern 134a. Thus, when the upper mask 132 is removed, the top surface of the lower mask layer 104 may be neither etched nor damaged.

Figure 14:
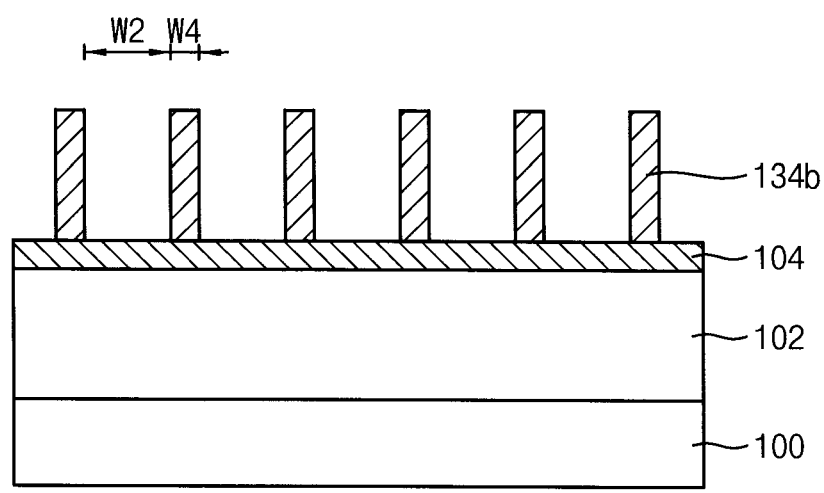

Referring to FIG. 14, the sacrificial layer patterns 130 and the filling layer pattern 136 may be removed, and the mask patterns 134b may remain on the lower mask layer 104. Each of the mask patterns 134b may have the width W4, and the mask patterns 134b may be spaced apart from each other by a distance equal to the width W2.

In the case in which the sacrificial layer patterns 130 and the filling layer pattern 136 constitute an ACL or a carbon containing layer, the sacrificial layer patterns 130 and the filling layer pattern 136 may be removed by a plasma ashing process.

In the case in which the sacrificial layer patterns 130 and the filling layer pattern 136 constitute a polysilicon layer, the sacrificial layer patterns 130 and the filling layer pattern 136 may be removed by an isotropic etching process.

Figure 15:
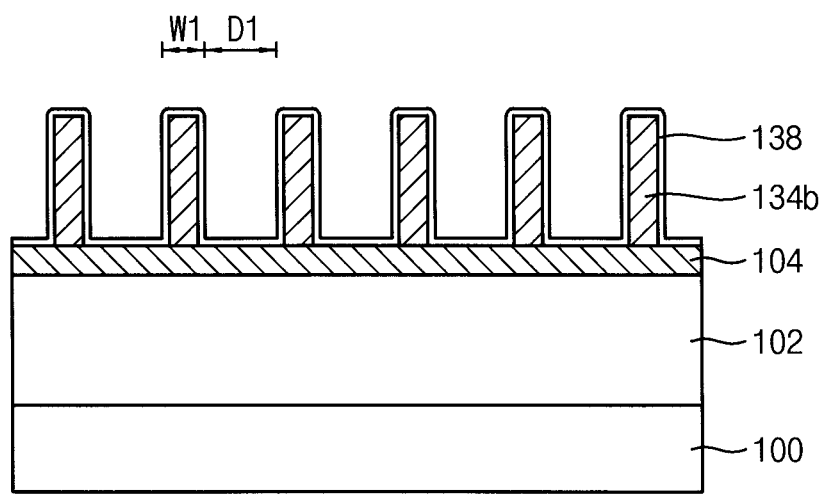

Referring to FIG. 15, an additional mask layer 138 may be conformally formed on the second preliminary mask pattern 134b and the lower mask layer 104.

The additional mask layer 138 may be formed so that a mask pattern structure 139 (refer to FIG. 16) may have a desired target width, e.g., the first width W1. A structure including the second preliminary mask pattern 134b and the additional mask layer 138 on both sidewall surfaces of the second preliminary mask pattern 134b may have a width W1 in the second direction.

The additional mask layer 138 may be formed of silicon oxide, for example, by a CVD process.

Figure 16:
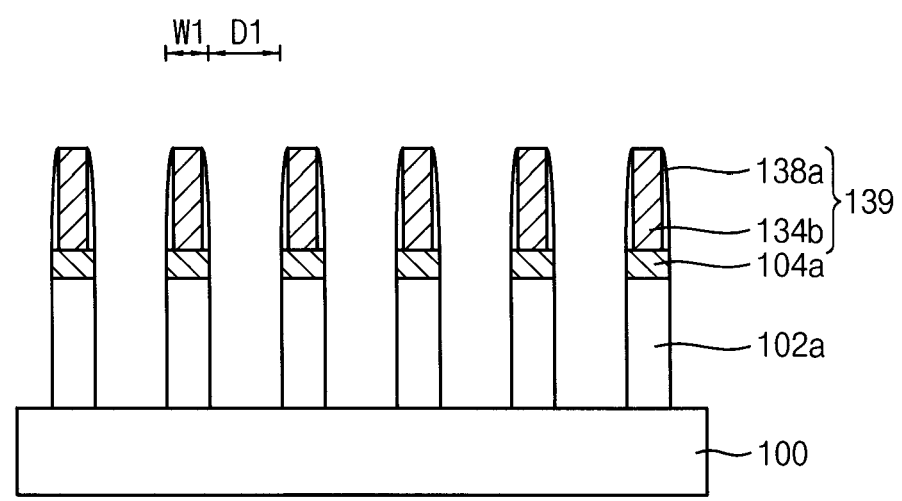

Referring to FIG. 16, the additional mask layer 138 may be anisotropically etched to form the mask pattern structure 139 including the second preliminary mask pattern 134b and an additional mask 138a.

The lower mask layer 104 may be anisotropically etched using the mask pattern structure 139 as an etching mask to form the lower mask 104a.

The etch target layer 102 may be etched using the lower mask 104a as an etching mask pattern to form the plurality of target layer patterns 102a. During the etching process, the lower mask 104a may be partially or completely removed.

Each of the target layer patterns 102a may have the first width in the second direction, and the target layer patterns 102a may be spaced apart from each other by the first distance.

As described above, each of the target layer patterns 102a may be formed using the mask pattern structure 139, so that any differences in height and variations among the widths of the target layer patterns 102a may be minimal.

FIGS. 17 to 20 illustrating stages in another example of a method of manufacturing a semiconductor device in accordance with the inventive concept.

First, a structure similar to that shown in FIG. 3 may be formed by processes similar to those illustrated in and described with reference to FIGS. 1 to 3.

Figure 17:
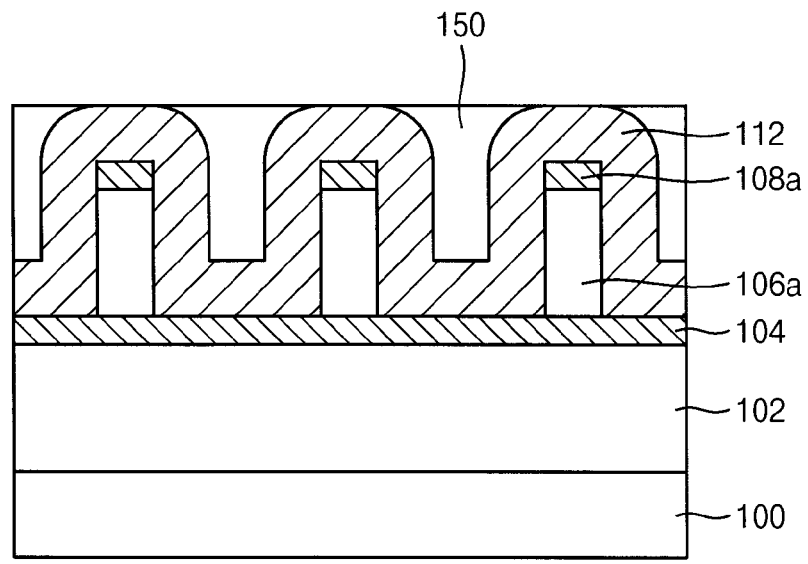

Referring to FIG. 17, a filling layer may be formed on the mask layer 112 to fill a space between portions of the mask layer 112 on sidewall surfaces of the sacrificial layer patterns 106a.

The filling layer may be formed of material substantially the same as the material of the sacrificial layer pattern 106a. For example, the filling layer may be an ACL layer or a carbon-containing layer. In this case, the filling layer may be formed by a spin coating process. Alternatively, the filling layer may be formed of polysilicon by a CVD process.

The filling layer may be planarized by an etch back process until a top surface of the mask layer 112 is exposed to form a filling layer pattern 150 filling the space between the portions of the mask layer 112 on sidewall surfaces of the sacrificial layer patterns 106a.

Figure 18:
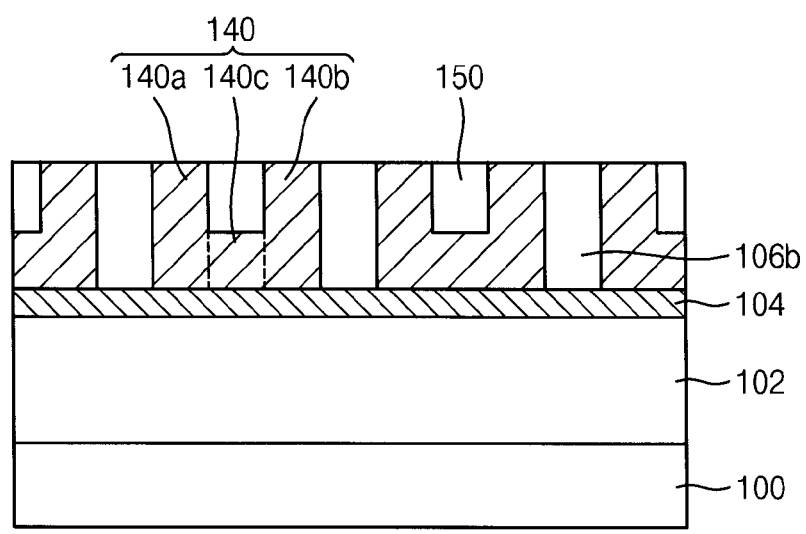

Referring to FIG. 18, upper portions of the mask layer 112, the filling layer pattern 150 and the upper mask 108a may be planarized until top surfaces of the sacrificial layer patterns 106a are exposed. The planarization process may include an etch back process and/or a chemical mechanical polishing (CMP) process.

As a result, the mask layer 112 may be transformed into a plurality of preliminary mask patterns 140 each including a first line 140a (linear section), a second line 140b (linear section) and a connection portion 140c connecting lower portions of the first and second lines 140a and 140b to each other. Each of the preliminary mask patterns 140 may have a cup-shaped cross, and each of the preliminary mask patterns 140 may extend longitudinally in the first direction. The upper mask 108a may be completely removed by the planarization process.

The process of removing the upper mask 108a does not expose the lower mask layer 104, and thus a top surface of the lower mask layer 104 may be neither etched nor damaged. Also, a top surface of each of the preliminary mask patterns 140 may be substantially flat. The preliminary mask patterns 140 may have substantially the same shape as one another.

Figure 19:
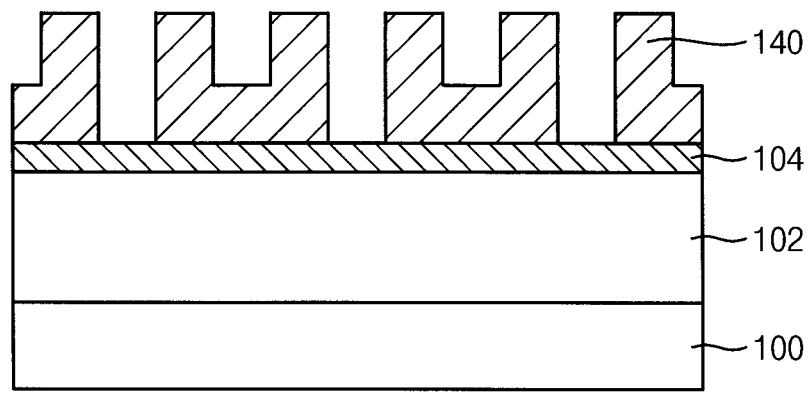

Referring to FIG. 19, the sacrificial layer patterns 106a and the filling layer pattern 150 may be removed.

In the case in which the sacrificial layer patterns 106a and the filling layer pattern 150 constitute an ACL or a carbon-containing layer, the sacrificial layer patterns 106a and the filling layer pattern 150 may be removed by a plasma ashing process.

In the case in which the sacrificial layer patterns 106a and the filling layer pattern 150 constitute a polysilicon layer, the sacrificial layer patterns 106a and the filling layer pattern 150 may be removed by an isotropic etching process.

Figure 20:
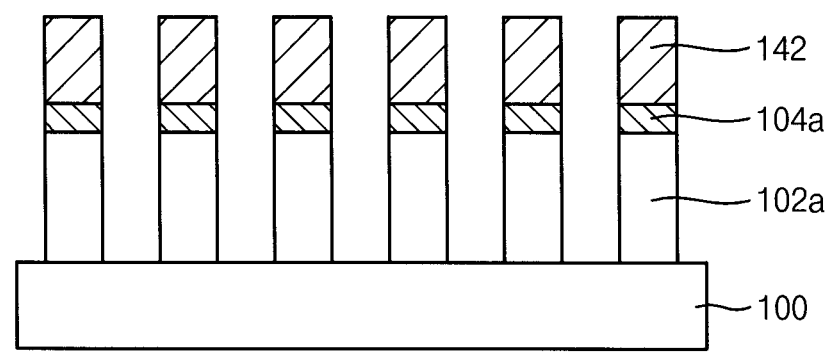

Referring to FIG. 20, the preliminary mask pattern 140 may be anisotropically etched, so that the connection portion of the preliminary mask pattern 140 may be removed to form a mask pattern 142 having a line and space pattern.

The lower mask layer 104 may be etched using the mask pattern 142 as an etching mask to form a lower mask 104a.

The etch target layer 102 may be anisotropically etched using the lower mask 104a and the mask pattern 142 as an etching mask to form a target layer pattern 102a. During the anisotropic etching process, the mask pattern 142 may be partially or completely removed.

FIGS. 21 to 27 are perspective views illustrating another example of a method of manufacturing a semiconductor device in accordance with the inventive concept. The semiconductor device may include a pattern of regularly disposed holes.

Figure 21:
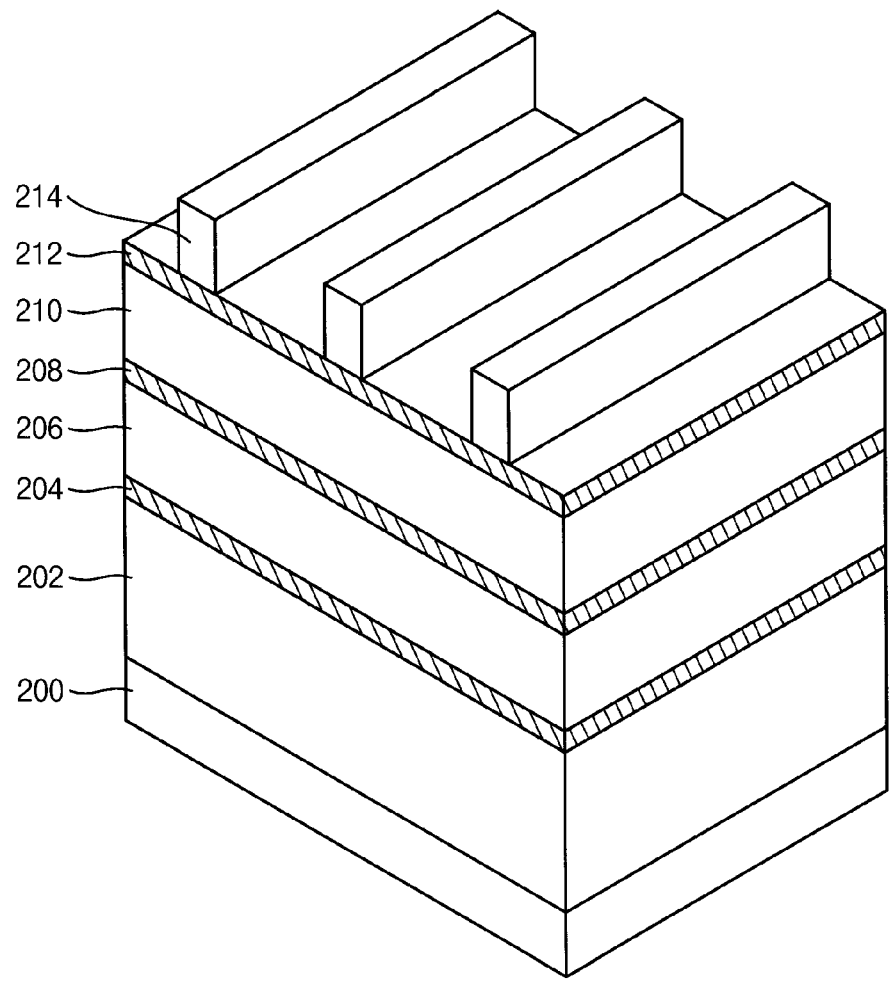

Referring to FIG. 21, an etch target layer 202 may be formed on a substrate 200. A first hard mask layer 204, a first sacrificial layer 206, a second hard mask layer 108, a second sacrificial layer 210 and a third hard mask layer 212 may be sequentially formed on the etch target layer 202. A first photoresist pattern 214 may be formed on the third hard mask layer 212.

The first photoresist pattern 214 may be formed in substantially the same way as the photoresist pattern 110 described with reference to FIG. 1. Alternatively, the first photoresist pattern 214 may be formed in the substantially the same way as the photoresist pattern described with reference to FIG. 9.

Figure 22:
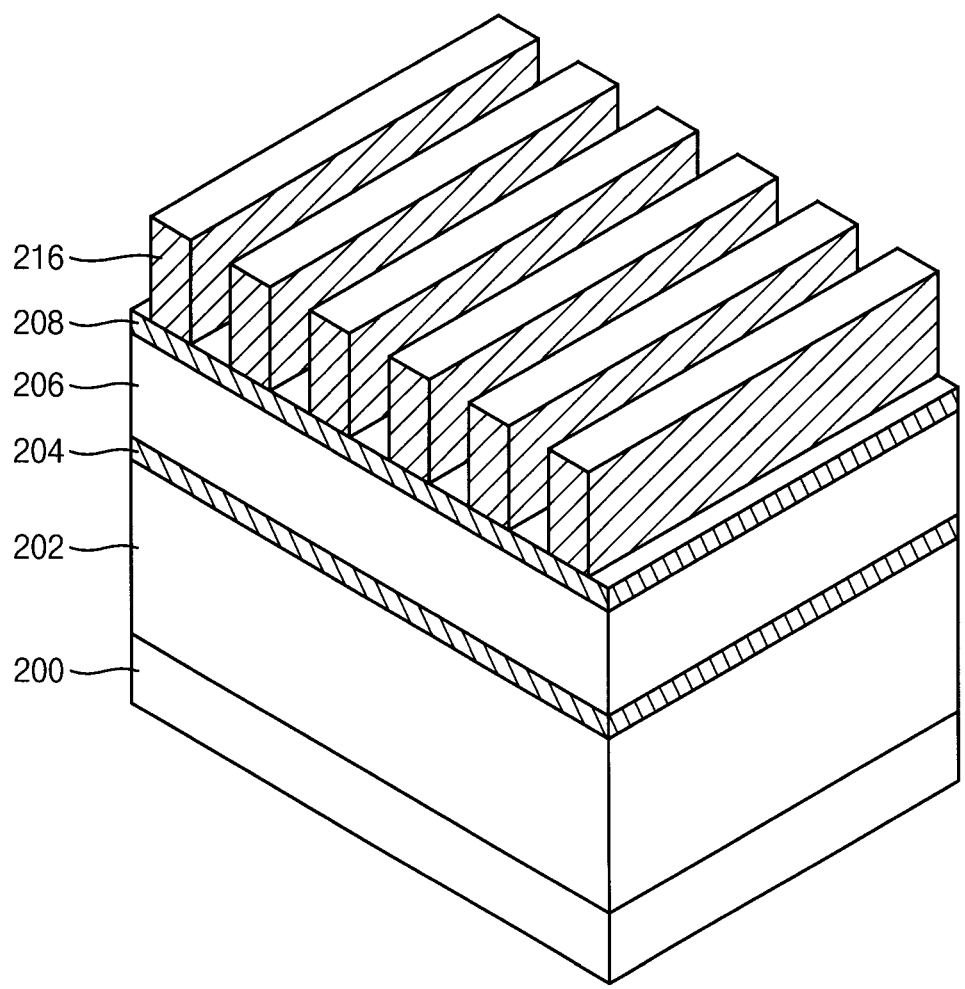

Referring to FIG. 22, a first mask pattern 216 may be formed on the second hard mask layer 208.

For example, the first mask pattern 216 may be formed by processes substantially the same as those illustrated in and describe with reference to FIGS. 2 to 7.

In particular, the third hard mask layer 212 may be anisotropically etched using the first photoresist pattern 214 as an etching mask to form a third hard mask (not shown). The second sacrificial layer 210 may be anisotropically etched using the third hard mask as an etching mask to form a second sacrificial layer pattern (not shown). A mask layer (not shown) may be conformally formed on the second sacrificial layer pattern, the third hard mask and the second hard mask layer 108, and the mask layer may be anisotropically etched to form first preliminary mask patterns (not shown).

A first filling layer pattern (not shown) may be formed to fill a space between f the first preliminary mask patterns. The third hard mask may be removed by an etch back process. Upper portions of the first preliminary mask patterns may be etched by the etch back process to form the first mask pattern 216. Then, the first filling layer pattern and the second sacrificial layer pattern may be removed.

In another example, the first mask pattern 216 may be formed by processes substantially the same as those illustrated in and described with reference to FIGS. 9 to 15. Alternatively, the first mask pattern may be formed by processes substantially the same as those illustrated in and described with reference to FIGS. 17 to 19.

Figure 23:
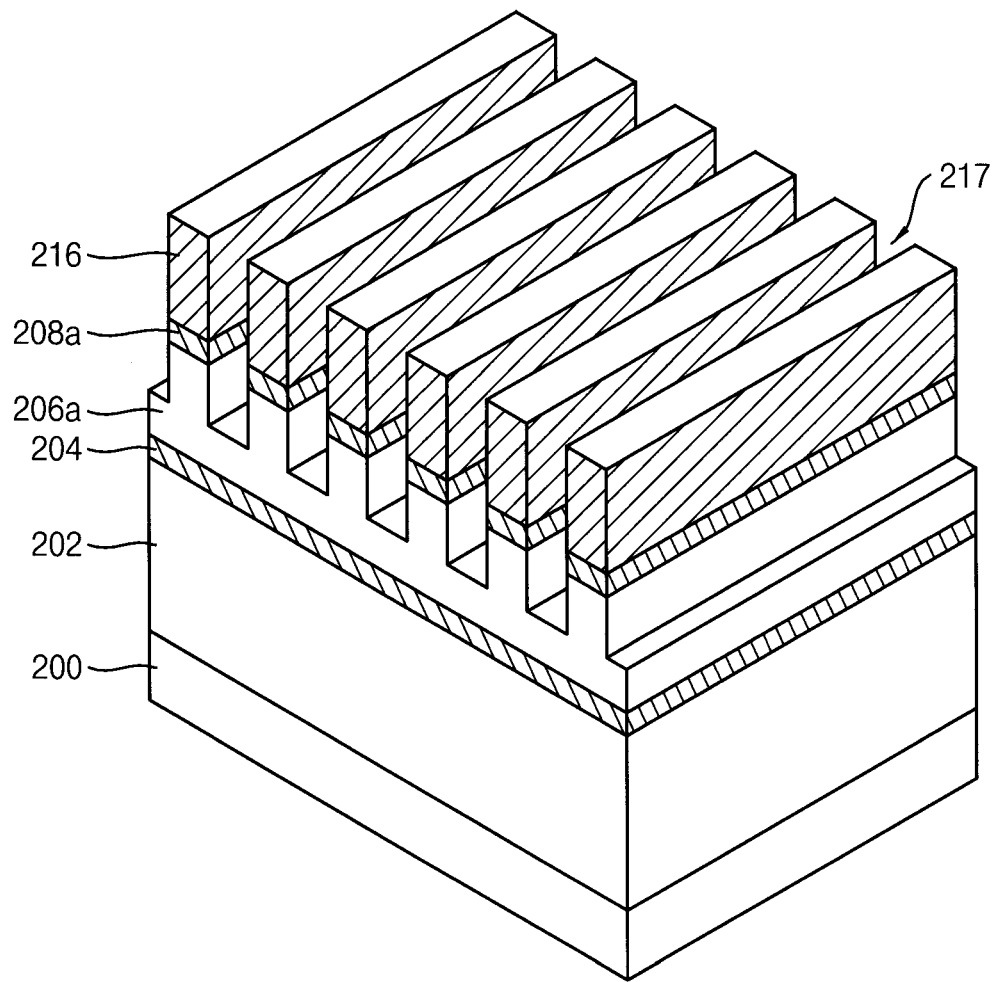

Referring to FIG. 23, the second hard mask layer 208 may be etched using the first mask pattern 216 as an etching mask to form second hard mask 208a. The second hard mask 208a may have linear sections (or "segments") of equal widths extending lengthwise in the first direction and spaced apart from each other by uniform distances in the second direction. Each of the second hard masks 208a may extend in the first direction.

During the etching process, the first sacrificial layer 206 between the second hard mask 208a may be partially etched to form a first preliminary sacrificial layer pattern 206a having first trenches 217 therein each extending longitudinally in a first direction.

Figure 24:
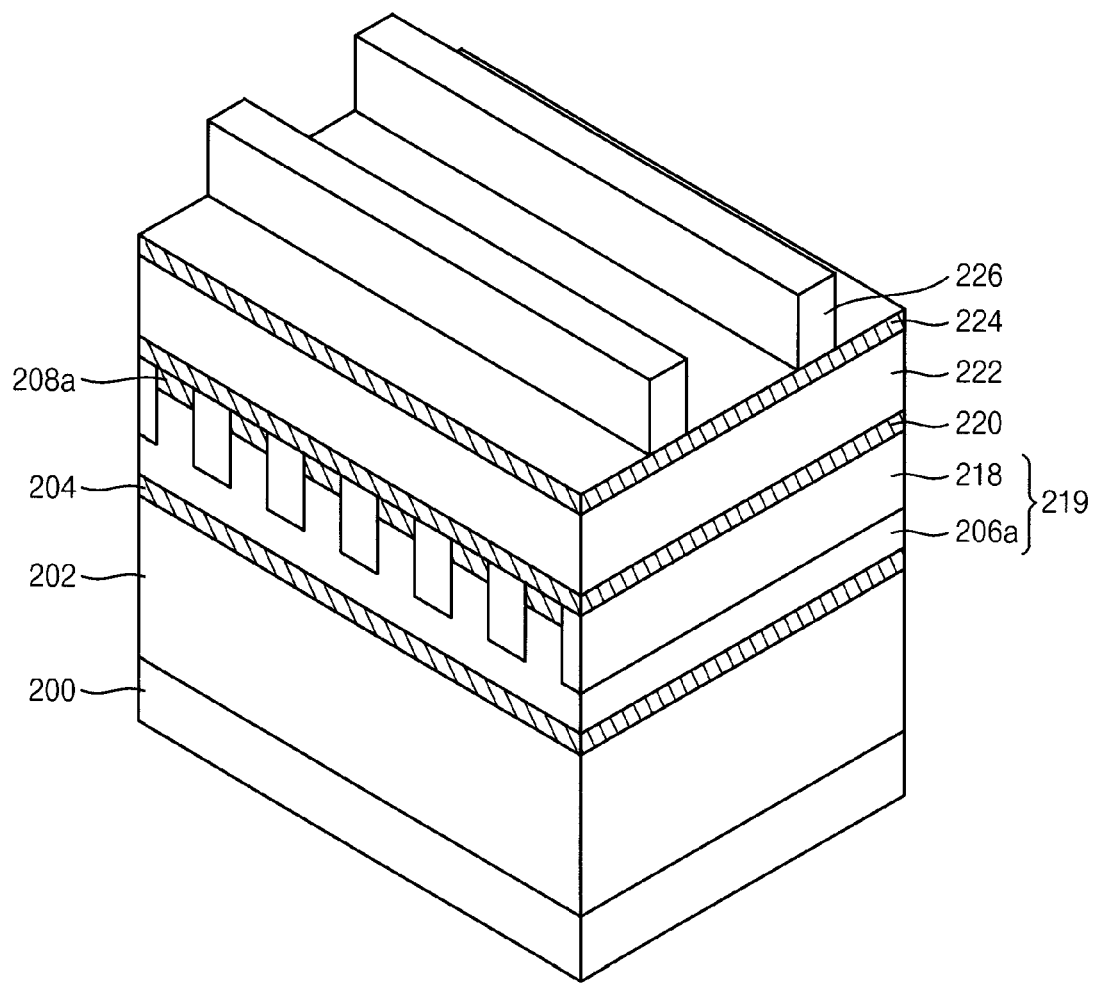

Referring to FIG. 24, a third sacrificial layer may be formed to sufficiently fill the first trenches 217. The first mask pattern 216 and the third sacrificial layer 218 may be etched until top surfaces of the second hard mask 208a are exposed to form third sacrificial layer patterns 218 in the first trenches 217.

Thus, a lower sacrificial layer pattern structure 219 including the first preliminary sacrificial layer patterns 206a and the third sacrificial layer pattern 218 may be formed.

The second hard mask 208a may be formed on the lower sacrificial layer pattern structure 219. Top surfaces of the third sacrificial layer patterns 218 and the second hard mask 208a may be substantially coplanar.

A fourth hard mask layer 220, a fourth sacrificial layer 222 and a fifth hard mask layer 224 may be sequentially formed on the lower sacrificial layer pattern structure 219 and the second hard mask 208a. A second photoresist pattern 226 may be formed on the fifth hard mask layer 224. The second photoresist pattern 226 may be a line and space pattern having lines of photoresist extending lengthwise in the second direction.

Figure 25:
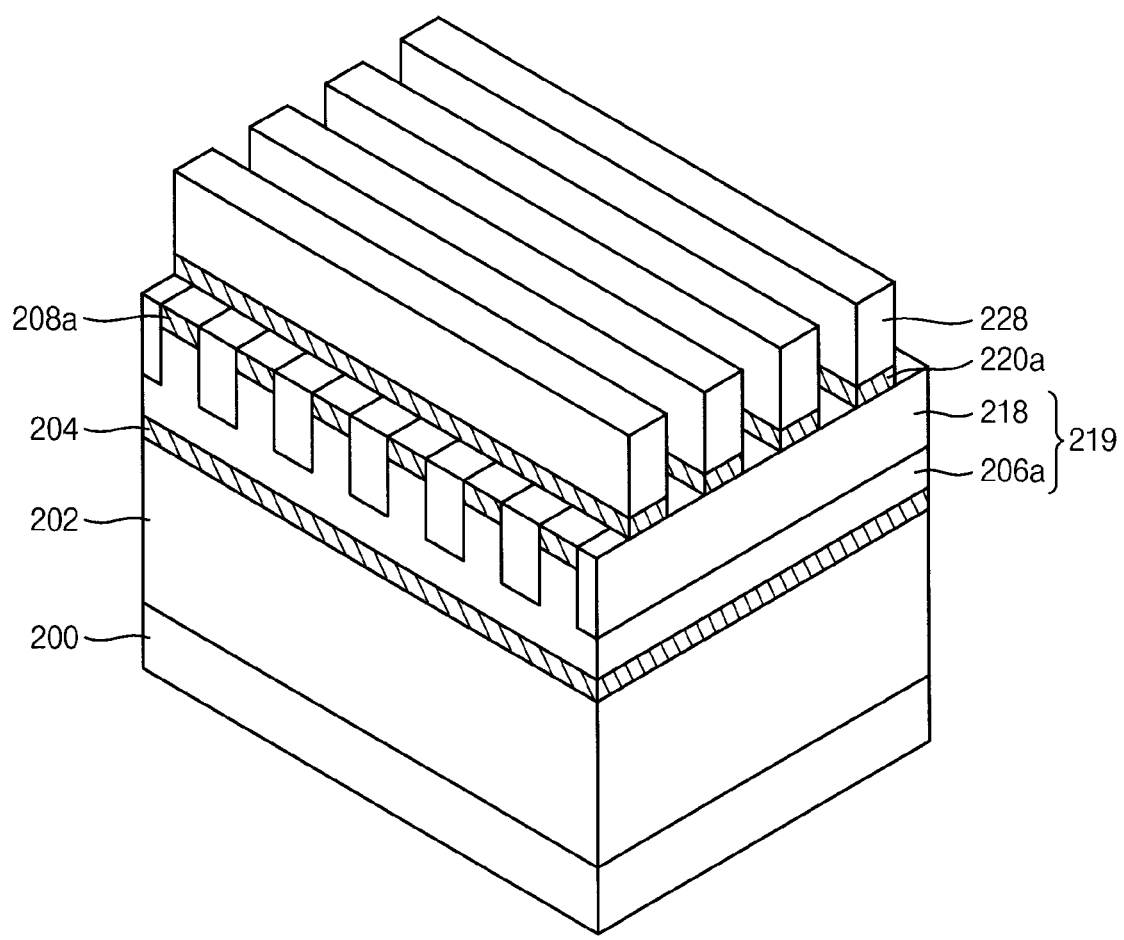

Referring to FIG. 25, a second mask pattern 228 may be formed on the fourth hard mask layer 220. The fourth hard mask layer 220 may be etched using the second mask pattern 228 as an etching mask to form a fourth hard mask 220a on the second hard mask 208a and the lower sacrificial pattern structure 219.

In particular, the fifth hard mask layer 224 may be anisotropically etched using the second photoresist pattern 226 as an etching mask to form a fifth hard mask (not shown). The fourth sacrificial layer 222 may be anisotropically etched using the fifth hard mask as an etching mask to form fourth sacrificial layer patterns (not shown). A mask layer (not shown) may be conformally formed on the fourth sacrificial layer patterns, the fifth hard mask and the fourth hard mask layer 220, and the mask layer may be etched to form preliminary second mask patterns (not shown).

A second filling layer pattern (not shown) may be formed to formed to fill a space between the preliminary second mask patterns. The fifth hard mask may be removed by an etch back process, and an upper portion of the preliminary second mask patterns may be etched by the etch back process to form second mask patterns 228. Then, the second filling layer pattern and the fourth sacrificial layer patterns between the second mask patterns 228 may be removed.

In one example, the second mask patterns 228 are formed by processes substantially the same as those illustrated in and described with reference to FIGS. 2 to 7. In other examples, the second mask patterns 228 are formed by processes substantially the same as those illustrated in and described with reference to FIGS. 9 to 15 or FIGS. 17 to 19.

Then, the fourth hard mask layer 220 may be etched using the second mask pattern 228 as an etching mask to form a fourth hard mask 220a. The fourth hard mask 220a may have sections (or "segments") extending lengthwise in the second direction, namely, a direction substantially perpendicular to the lengthwise direction of the segments of the second hard mask 208a.

Figure 26:
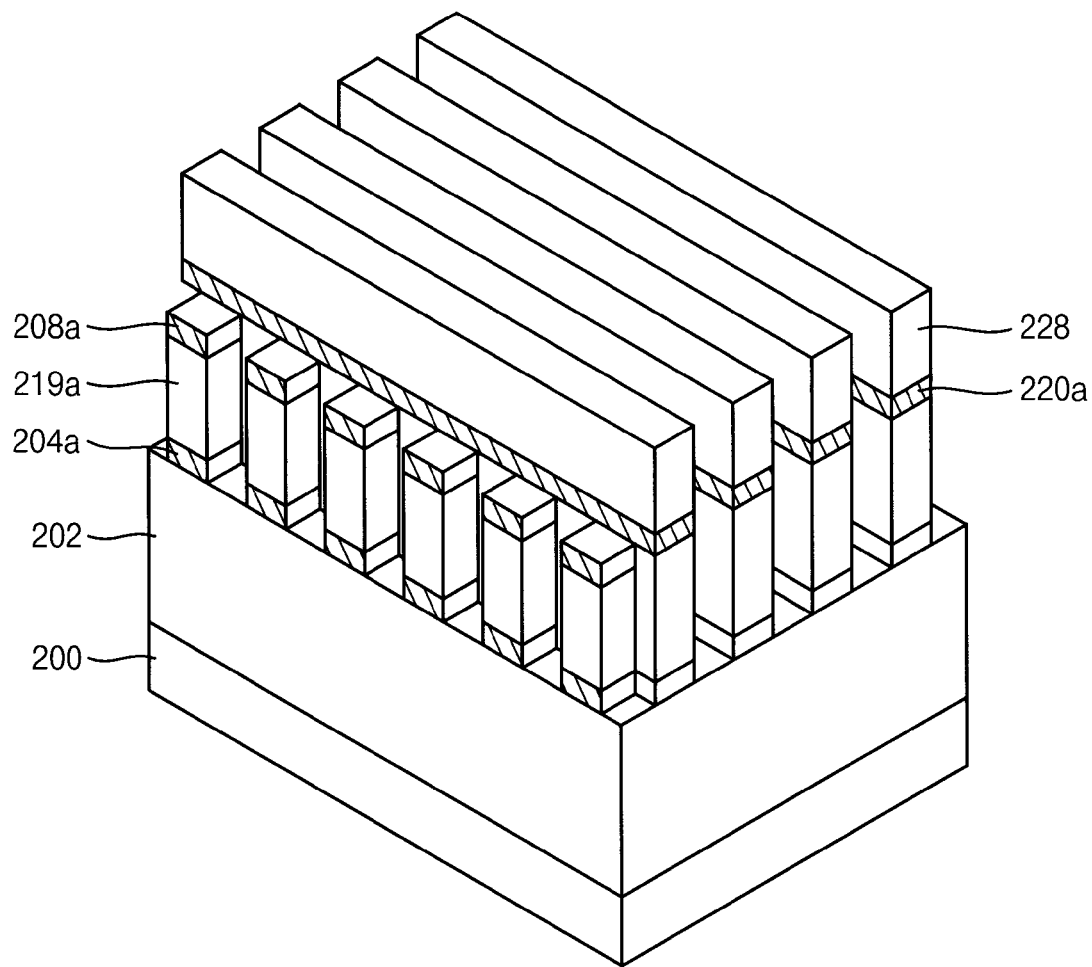

Referring to FIG. 26, portions of the lower sacrificial layer pattern structure 219 between the second and fourth hard masks 208a and 220a may be etched to form a plurality of holes. Hereinafter, the lower sacrificial layer pattern structure having the holes therein will be designated by reference numeral 219a.

The first hard mask layer 204 exposed by the holes may be etched to form a first hard mask 204a. The first hard mask 204a may have regularly spaced holes extending therethrough. During the etching process, layers on the first hard mask 204a may be partially or completely removed. In one example, the layers on the first hard mask 204a are removed.

Figure 27:
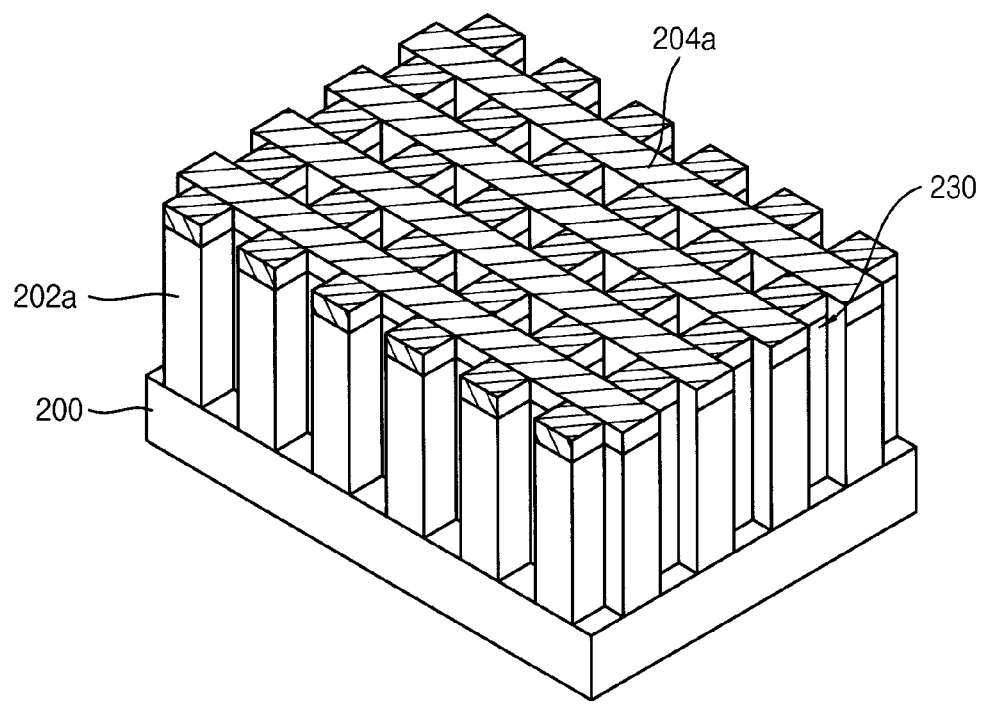

Referring to FIG. 27, the etch target layer 202 may be anisotropically etched using the first hard mask 204a as an etching mask to form a target layer pattern 202 including holes.

According to the examples of the method described above, the target layer pattern 202 has regularly spaced holes extending therein, and variations among the widths of the holes in the target layer pattern 202 are minimal.

FIGS. 28 to 36 illustrate another method of manufacturing a semiconductor device in accordance with the inventive concept.

Figure 28:
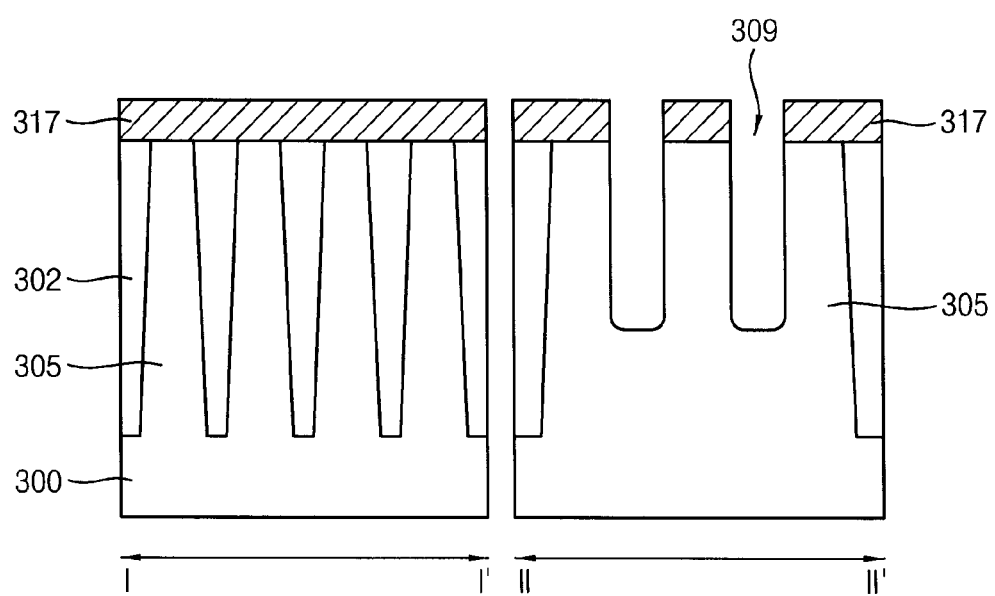
Figure 29:
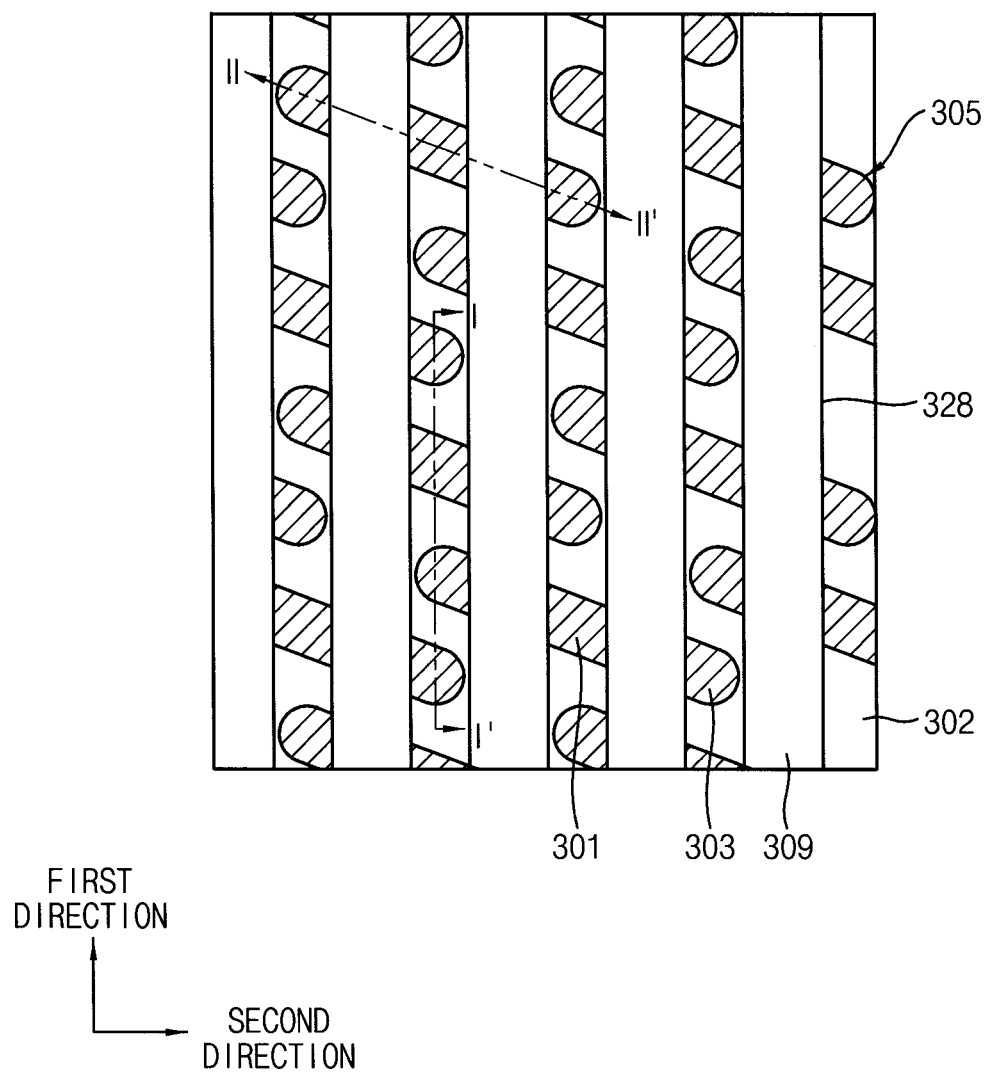

Referring to FIGS. 28 and 29, an isolation layer 302 may be formed on a substrate 300 to define an active pattern 305.

The isolation layer 302 may be formed by a shallow trench isolation (STI) process. For example, an upper portion of the substrate 300 may be partially removed by an anisotropic etching process to form an isolation trench (not shown). An insulation layer of silicon oxide, for example, may be formed on the substrate 300 to fill the isolation trench. An upper portion of the insulation layer may be planarized by a CMP process, for example, until a top surface of substrate 300 is exposed to form the isolation layer 302. That portion of the substrate 300 whose top surface is not covered by the isolation layer 302 may be defined as the active pattern 305.

In the illustrated example of this method, several active patterns are formed as spaced apart from each other. As illustrated in FIG. 29, each of the active patterns 305 may extend in a diagonal direction subtending an acute angle with a first direction.

A first hard mask 317 may be formed on the isolation layer 302 and the active patterns 305. The first hard mask 317 has mask segments extending in the first direction.

In one example of this method, the first hard mask 317 is formed by processes substantially the same as those illustrated in and described with reference to FIGS. 1 to 8 for forming the lower mask 104a. In other examples, the first hard mask 317 may be formed by processes substantially the same as those processes for forming the lower mask 104a illustrated in and described with reference to FIGS. 9 to 16 or FIGS. 17 to 20.

Upper portions of the active patterns 305 and the isolation layer 302 may be etched using the first hard mask 317 as an etching mask to form gate trenches 309 each extending in the first direction. Variations in the width among the gate trenches 309 may be relatively small.

Figure 30:
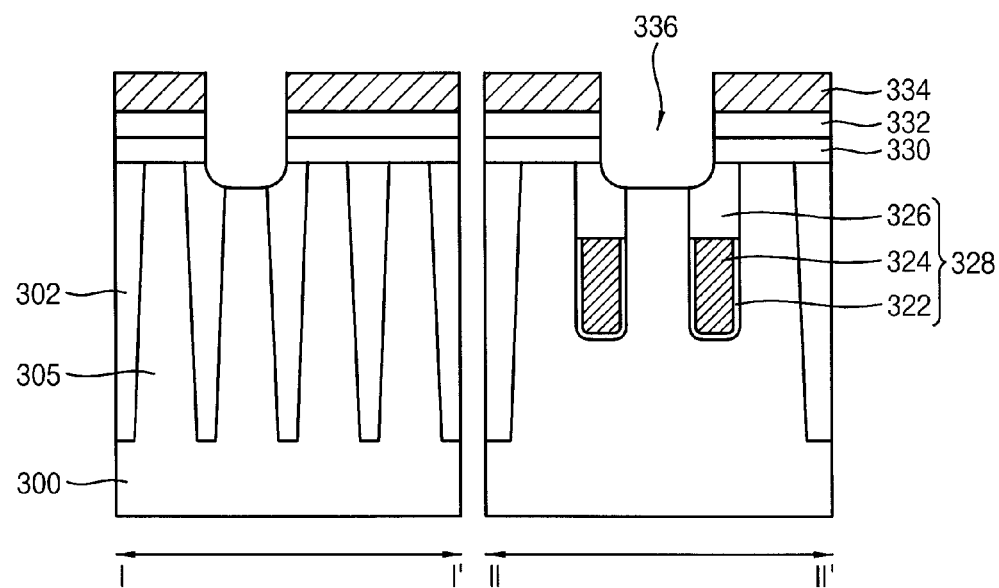

Referring to FIG. 30, gate structures 328 may be formed in the gate trenches 309, respectively. Because the variation among the widths of the gate trenches 309 is relatively small, the gate structures 328 may have substantially the same widths.

In one example of this method, a gate insulation layer is formed by a thermal oxidation process at a surface of the active pattern 305 exposed by the gate trench 309. Alternatively, the gate insulation layer may be formed by depositing silicon oxide or a metal oxide through a CVD process, for example.

A gate conductive layer filling a remaining portion of the gate trench 309 may be formed on the gate insulation layer. The gate conductive layer may be planarized by a CMP process until a top surface of the active pattern 305 is exposed, and upper portions of the gate insulation layer and the gate conductive layer may be removed by an etch back process. Thus, a gate insulation layer pattern 322 and a gate electrode 324 filling a lower portion of the gate trench 309 may be formed.

A mask layer filling a remaining portion of the gate trench 309 may be formed on the gate insulation layer 322 and the gate electrode 324, and an upper portion of the mask layer may be planarized until the top surface of the active pattern 305 is exposed to form a gate mask 326.

Thus, a gate structure 328 including the gate insulation layer pattern 322, the gate electrode 324 and the gate mask 326 sequentially stacked may be formed in each gate trench 309.

An ion implantation process may be performed to form impurity regions 301 and 303 (refer to FIG. 29) at upper portions of the active pattern 305 adjacent to the gate structure 328.

An etch stop layer 330 covering the active pattern 305, the isolation layer 302 and the gate structure 328 may be formed, and a first insulating interlayer 332 may be formed on the etch stop layer 330. A first conductive layer 334 may be formed on the first insulating interlayer 332.

The first conductive layer 334, the first insulating interlayer 332 and the etch stop layer 330 may be sequentially and partially etched to form a first hole 336 through which the active pattern 305 between the gate structures 328 is exposed.

Figure 31:
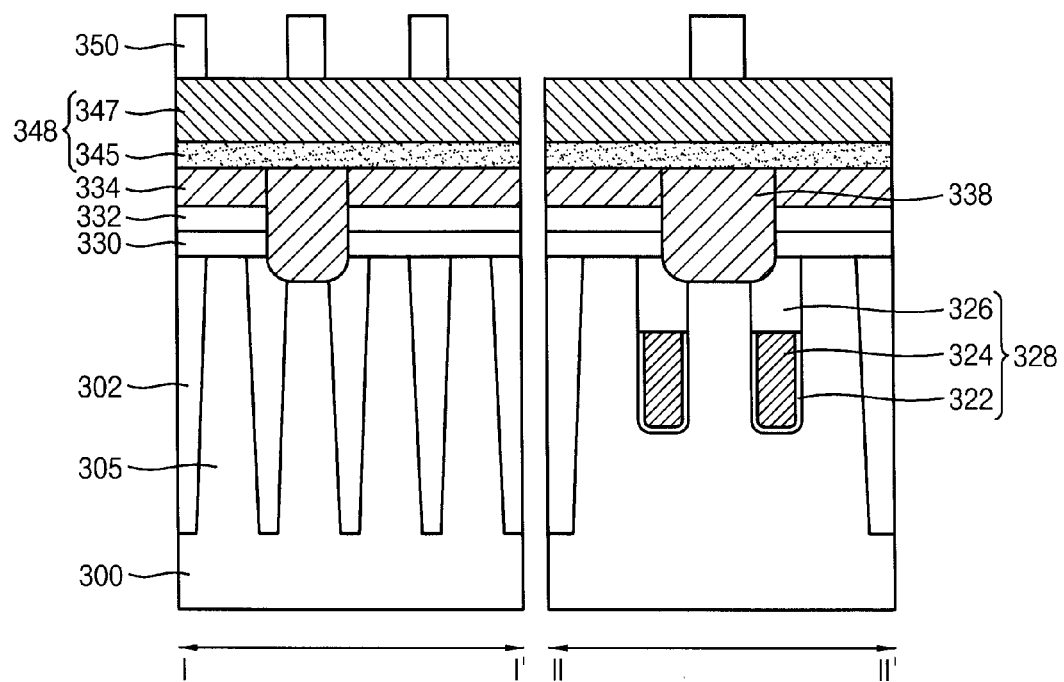

Referring to FIG. 31, a second conductive layer 338 filling the first hole 336 may be formed on the exposed active pattern 305 and the first conductive layer 334. The second conductive layer 338 may be formed of material substantially the same as the material of the first conductive layer 334. For example, the first and second conductive layers 334 and 338 may be formed of doped polysilicon.

The first and second conductive layers 334 and 338 may be planarized until top surfaces of the first and second conductive layers 334 and 338 are flat.

A third conductive layer 348 including a barrier layer 345 and a metal layer 347 sequentially stacked may be formed on the first and second conductive layers 334 and 338.

A second hard mask 350 extending in a second direction substantially perpendicular to the first direction may be formed on the third conductive layer 348.

The second hard mask 350 may be formed by processes substantially the same as the processes for forming the lower mask 104a illustrated in and described with reference to FIGS. 1 to 8. In other examples, the second hard mask 350 is formed by processes substantially the same as the processes for forming the lower mask 104a illustrated in and described with reference to FIGS. 9 to 16 or FIGS. 17 to 20.

Figure 32:
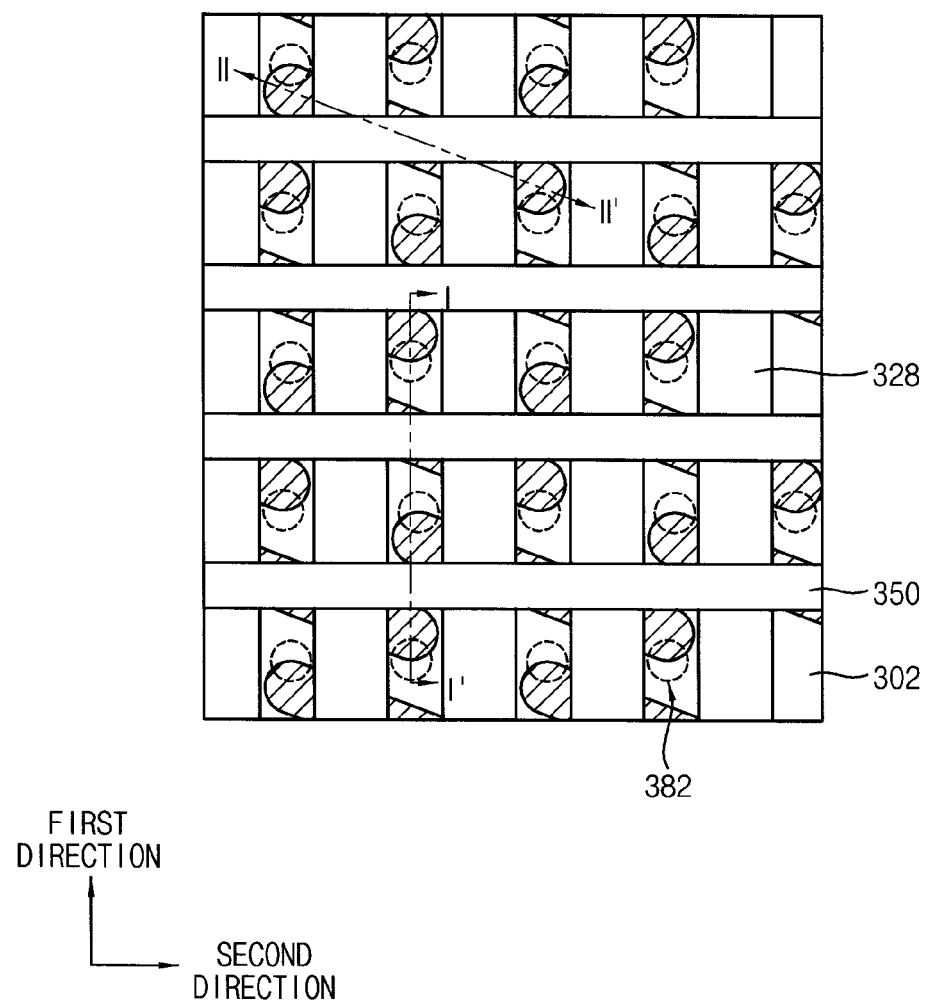
Figure 33:
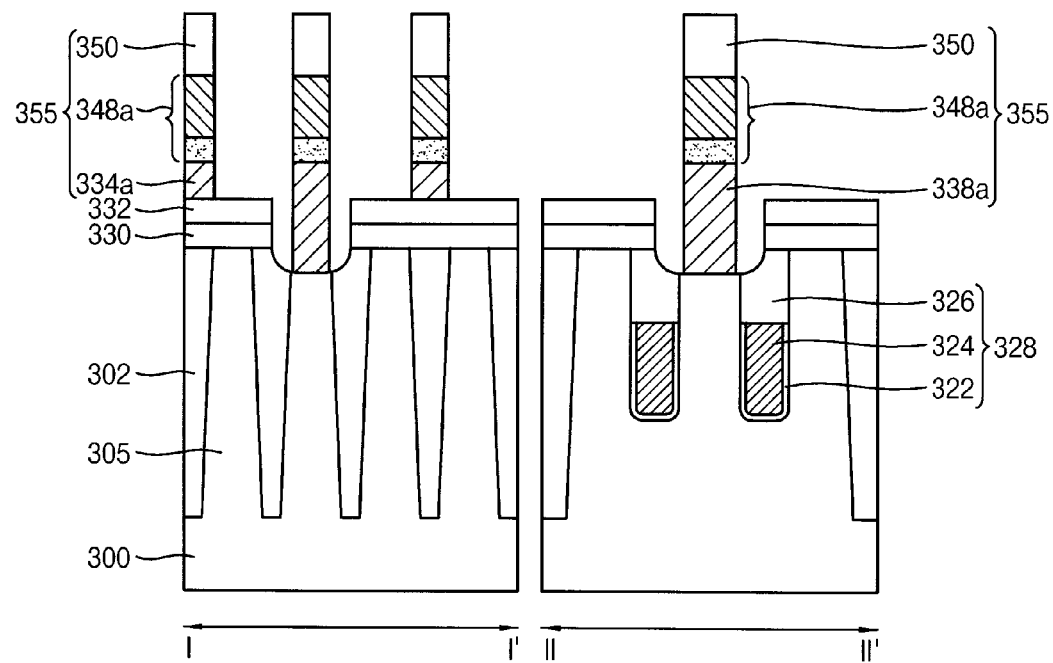

Referring to FIGS. 32 and 33, the first to third conductive layers 334, 338 and 348 may be etched using the second hard mask 350 as an etching mask to form a bit line structure 355 including a first conductive pattern 334a, a second conductive pattern 338a, a third conductive pattern 348a and the second hard mask 350.

In the illustrated example, the bit line structure 355 is narrower than the first hole 336. Thus, sidewall surfaces of the bit line structure 355 and sides of the first hole 336 may be spaced from each other in a direction perpendicular to the sidewall surfaces.

In the illustrated example, a plurality of bit line structures 355 may be formed using the second hard mask 350 as an etching mask, so that each of the bit line structures 355 may have a small width, and any variation among the widths of the bit line structures 355 may be relatively small.

Figure 34:
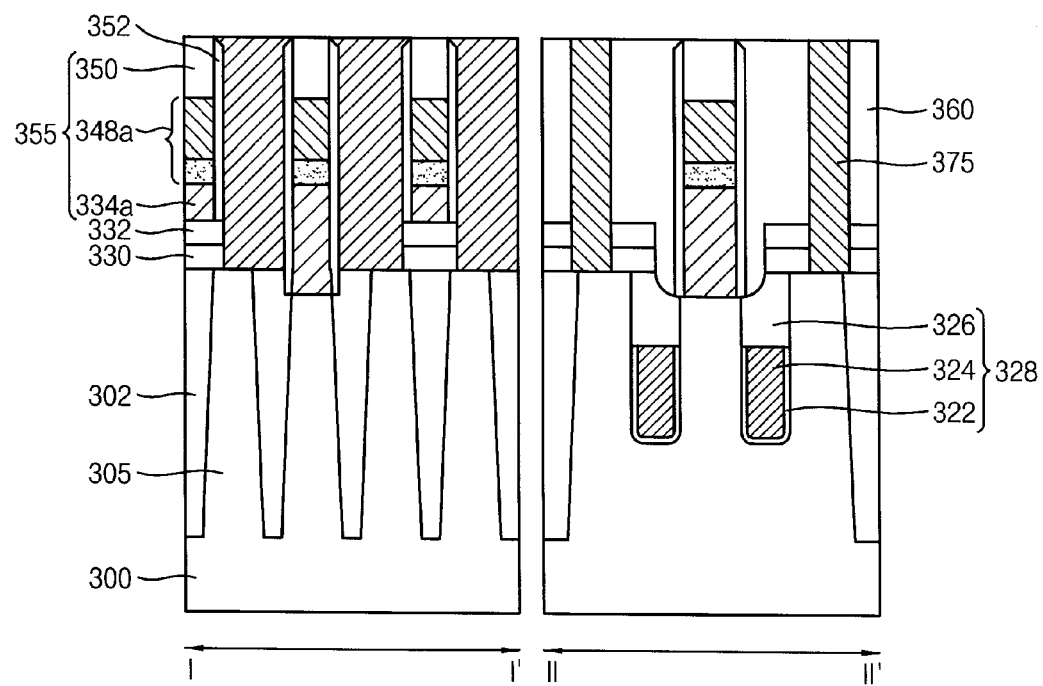

Referring to FIG. 34, a spacer 352 may be formed on the sidewall surfaces of the bit line structure 355.

A second insulating interlayer 360 may be formed on the first insulating interlayer 332 to cover the bit line structure 355. The second insulating interlayer 360 may be planarized until a top surface of the second insulating interlayer 360 is flat.

The second insulating interlayer 360, the first insulating interlayer 332 and the etch stop layer 330 may be etched to form a contact hole (not shown) exposing a top surface of the active pattern 305.

A contact plug 375 may be formed to fill the contact hole. The contact plug 375 and the active pattern 305 may be electrically connected with each other. In particular, a conductive layer may be formed to fill the contact hole, and an upper portion of the conductive layer may be planarized until a top surface of the second hard mask 350 is exposed.

Figure 35:
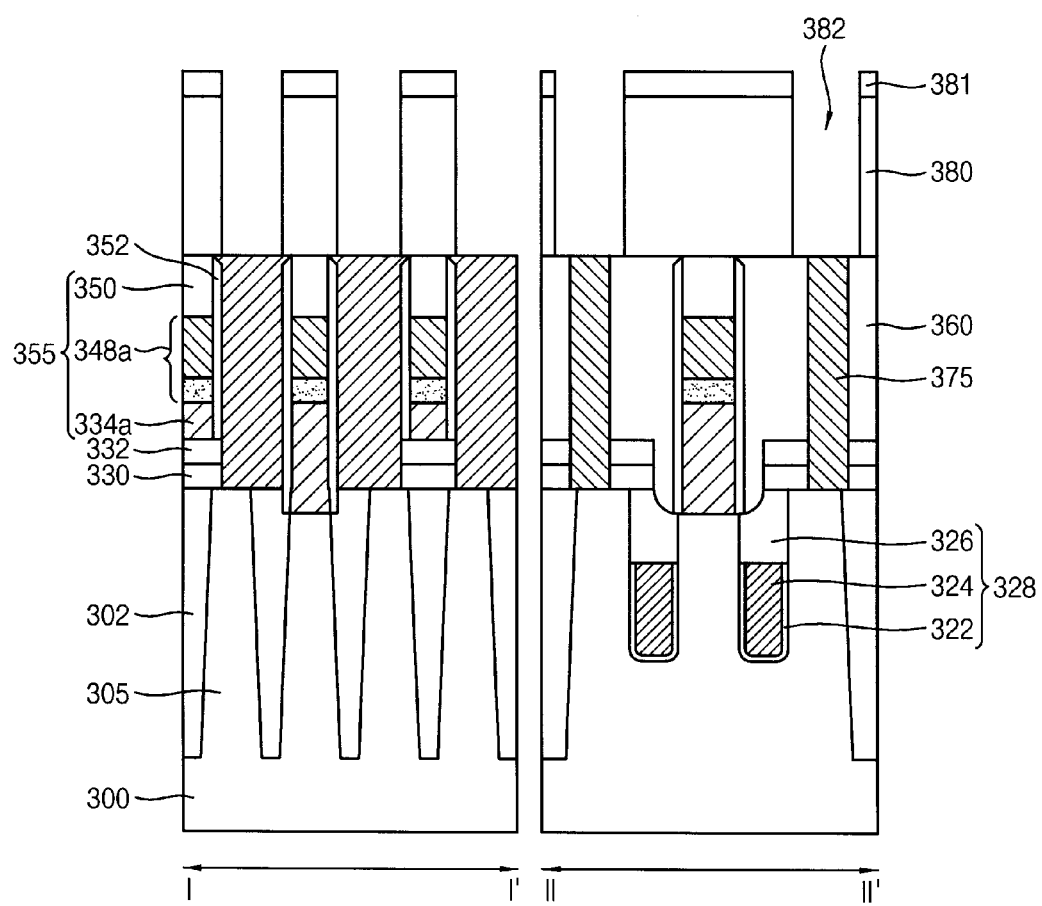

Referring to FIG. 35, an etch stop layer (not shown) and a mold layer may be formed on the second hard mask 350, the second insulating interlayer 360 and the contact plug 375.

A third hard mask 381 including a hole (not shown) may be formed on the mold layer. The hole may be formed to overlap a top surface of the contact plug 375.

In an example of this method, the third hard mask 381 is formed by processes substantially the same as the processes for forming the first hard mask 204a illustrated in and described with reference to FIGS. 21 to 27.

The mold layer and the etch stop layer may be etched using the third hard mask 381 as an etching mask to form a mold layer pattern 380 including a capacitor opening 382 through which a top surface of the contact plug 375 is exposed.

Figure 36:
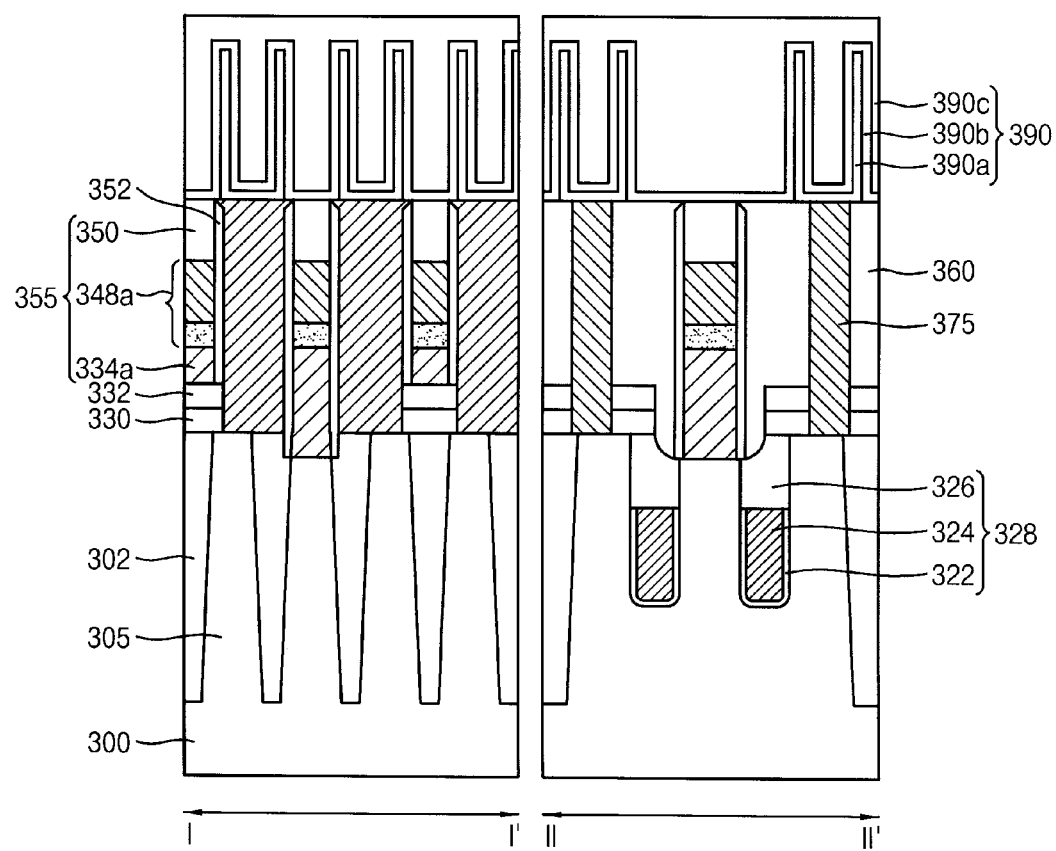

Referring to FIG. 36, a capacitor 390 may be formed on the contact plug 375. The capacitor 390 and the contact plug 375 may be electrically connected with each other. Thus, a dynamic random access memory (DRAM) device may be manufactured.

In particular, a lower electrode layer may be conformally formed on the exposed top surface of the contact plug 375, a sidewall of the capacitor opening 382 and a top surface of the mold layer 380. A sacrificial layer (not shown) may be formed on the lower electrode layer, and upper portions of the sacrificial layer and the lower electrode layer may be planarized until a top surface of the mold layer 380 is exposed. The sacrificial layer and the mold layer 380 may be removed to form a lower electrode 390a.

A dielectric layer 390b may be formed on the etch stop layer and the lower electrode 390a, and an upper electrode 390c may be formed on the dielectric layer 390b to form the capacitor 390. The dielectric layer 390b may be formed to of silicon oxide or a metal oxide having a high dielectric constant. The lower and upper electrodes 390a and 390c may be formed of a metal, e.g., tungsten (W), titanium (Ti), tantalum (Ta), or ruthenium (Ru), or a nitride of such a metal.

As described above, a semiconductor device made in accordance with the inventive concept may have target layer patterns and/or contact plugs each having a minute width. Also, a variation among the widths of the target layer patterns or the contact plugs may be minimal.

A method in accordance with the inventive concept may be applied to the manufacturing of any of various types of semiconductor devices including a pattern having a minute critical dimension. Applying the inventive concept to the forming of wirings, contact plugs, etc., of a semiconductor device allows for a highly integrated semiconductor device to be formed.

Finally, examples of the inventive concept have been described above in detail. The inventive concept may, however, be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:

1. A method of manufacturing a semiconductor device, the method comprising:
    forming a plurality of sacrificial layer line patterns on an etch target, each of the sacrificial layer line patterns extending longitudinally in a first direction so as to have sidewall surfaces facing in a second direction substantially perpendicular to the first direction;
    forming preliminary mask patterns on the sidewall surfaces of the sacrificial layer patterns, respectively;
    forming a filling layer in spaces between the preliminary mask patterns;
    etching back the preliminary mask patterns to remove upper portions of the preliminary mask patterns to form a plurality of while leaving lower portions of the preliminary mask patterns on the sidewall surfaces of the sacrificial layer patterns as a plurality of finalized mask patterns, respectively, each of the finalized mask patterns being symmetric with respect to a plane passing a center point of each of the finalized mask patterns in the second direction and extending in the first direction;
    removing the sacrificial layer line patterns and the filling layer while substantially leaving the plurality of finalized mask patterns on the etch target;
    etching the etch target using by performing an etch process in which the plurality of finalized mask patterns as constitutes an etching mask to form a plurality of target layer patterns; and
    forming an upper mask having respective sections disposed on the sacrificial layer patterns, respectively,
    wherein the sections of the upper mask are left on the sacrificial layer patterns during the forming of the preliminary mask patterns, and the etching back of the preliminary mask patterns removes the sections of the upper mask as the upper portions of the preliminary mask patterns are being removed.

2. The method of claim 1, wherein the sacrificial layer line patterns and the filling layer are formed of substantially the same materials.

3. The method of claim 2, wherein the sacrificial layer line patterns and the filling layer together constitute a carbon-containing layer or a polysilicon layer.

4. The method of claim 1, wherein forming the preliminary mask patterns includes:
    conformally forming a mask layer on the sacrificial layer patterns and the etch target; and
    anisotropically etching the mask layer.

5. The method of claim 1, wherein each of the sacrificial layer line patterns has a width substantially equal to a first distance, and a distance between adjacent ones of the sacrificial layer line patterns is substantially the same as the sum of the first distance and twice a first width, the first distance being substantially equal to a distance between adjacent ones of the target layer patterns, and the first width being substantially equal to the width of each of the target layer patterns.

6. The method of claim 5, wherein each of the preliminary mask patterns is formed to have the first width.

7. The method of claim 1, wherein each of the sacrificial layer line patterns has a width greater than a first distance, and a distance between adjacent ones of the sacrificial layer patterns is less than the sum of the first distance and twice a first width, the first distance being substantially equal to a distance between adjacent ones of the target layer patterns, and the first width being substantially equal to the width of each of the target layer patterns.

8. The method of claim 7, wherein each of the preliminary mask patterns is formed to have a width less than the first width.

9. The method of claim 8, wherein a distance between the preliminary mask patterns is greater than the first distance.

10. A method of manufacturing a semiconductor device, the method comprising:
    forming a plurality of sacrificial layer line patterns on an etch target, each of the sacrificial layer patterns extending longitudinally in a first direction;
    conformally forming a mask layer on the sacrificial layer pattern and the etch target;
    forming a filling layer in spaces between neighboring portions of the mask layer;
    etching upper portions of the mask layer to expose a top surface of the sacrificial layer pattern to form a plurality of mask patterns, each of the mask patterns including a first linear section, a second linear section and a connecting portion connecting the first and second linear sections to each other at bottom parts of the first and second linear portions;
    removing the sacrificial layer line patterns and the filling layer; and
    anisotropically etching the connecting portion of each of the mask patterns and the etch target to form a plurality of target layer patterns.

11. The method of claim 10, further comprising forming an upper mask having sections disposed on the sacrificial layer patterns, respectively.

12. The method of claim 11, wherein the upper mask pattern is removed when the upper portions of the preliminary mask patterns are etched.

13. The method of claim 10, further comprising forming a lower mask layer on the etch target.

14. A method of manufacturing a semiconductor device, comprising:
    forming a sacrificial layer pattern structure on an etch target;
    selectively etching the sacrificial layer pattern structure to form holes extending therethrough and exposing the etch target; and
    subsequently etching the etch target using the sacrificial layer pattern structure as an etch mask to thereby form holes in the etch target corresponding to the holes extending through the sacrificial layer pattern structure,
    wherein the forming of the sacrificial layer pattern structure comprises:
    forming a first sacrificial layer on the etch target,
    forming a first mask layer on the sacrificial layer,
    forming a plurality of sacrificial layer line patterns on the first mask layer, each of the sacrificial layer line patterns extending longitudinally in a first direction so as to have sidewall surfaces facing in a second direction substantially perpendicular to the first direction,
    forming preliminary mask patterns on the sidewall surfaces of the sacrificial layer patterns, respectively,
    forming a filling layer in spaces between the preliminary mask patterns,
    etching upper portions of the preliminary mask patterns to form a plurality of first mask patterns, each of the first mask patterns being symmetric with respect to a plane passing a center point of each of the mask patterns in the second direction and extending in the first direction, removing the sacrificial layer line patterns and the filling layer, and etching the first mask layer using the first mask patterns as an etch mask to form a first mask having sections extending longitudinally in the first direction and spaced apart in the second direction, and etching the first sacrificial layer using the first mask to form first sacrificial layer patterns extending longitudinally in the first direction.

15. The method of claim 14, wherein the sacrificial layer line patterns and the filling layer are formed of substantially the same materials.

16. The method of claim 14, wherein forming the preliminary mask patterns includes:
   conformally forming a mask layer on the sacrificial layer patterns and the etch target; and
   anisotropically etching the mask layer conformally formed on the sacrificial layer patterns and the etch target.

17. The method of claim 14, wherein the etching of the sacrificial layer pattern structure comprises forming a second mask on the sacrificial layer pattern structure, and etching the sacrificial layer pattern structure using the second mask as an etch mask, and
   the forming of the second mask comprises:
      forming a second mask layer on the sacrificial layer pattern structure,
      forming a plurality of second sacrificial layer line patterns on the second mask layer,
      forming second preliminary mask patterns on the sidewall surfaces of the second sacrificial layer patterns, respectively,
      forming a second filling layer in spaces between the second preliminary mask patterns,
      etching upper portions of the second preliminary mask patterns to form a plurality of second mask patterns,
      removing the second sacrificial layer line patterns and the second filling layer, and
      etching the second mask layer using the first mask patterns as an etch mask to form the second mask, the second mask having sections extending longitudinally across the sections of the first mask.

18. The method of claim 17, wherein forming the second preliminary mask patterns includes:
   conformally forming a mask layer on the second sacrificial layer patterns and the etch target; and
   anisotropically etching the mask layer conformally formed on the second sacrificial layer patterns.

* * * * *